US012628642B2

(12) United States Patent
Chiu

(10) Patent No.: US 12,628,642 B2
(45) Date of Patent: May 12, 2026

(54) CIRCUIT STRUCTURE INCLUDING AT LEAST ONE AIR GAP AND METHOD FOR MANUFACTURING THE SAME

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 136 days.

(21) Appl. No.: 18/117,558

(22) Filed: Mar. 6, 2023

(65) Prior Publication Data

US 2024/0304522 A1    Sep. 12, 2024

(51) Int. Cl.
| | |
|---|---|
| *H10W 20/40* | (2026.01) |
| *H10P 14/60* | (2026.01) |
| *H10W 10/00* | (2026.01) |
| *H10W 10/20* | (2026.01) |
| *H10W 20/00* | (2026.01) |
| *H10W 20/41* | (2026.01) |
| *H10W 20/43* | (2026.01) |
| *H10W 20/46* | (2026.01) |
| *H10W 20/47* | (2026.01) |
| *H10W 20/48* | (2026.01) |
| *H10W 44/00* | (2026.01) |

(52) U.S. Cl.
CPC ......... *H10W 20/483* (2026.01); *H10W 20/48* (2026.01); *H10W 44/601* (2026.01); *H10P 14/60* (2026.01); *H10W 10/021* (2026.01); *H10W 10/20* (2026.01); *H10W 20/435* (2026.01)

(58) Field of Classification Search
CPC ............... H01L 23/4821; H01L 21/764; H01L 21/7682; H01L 2221/1042; H01L 21/76264; H10D 62/115
See application file for complete search history.

(56) References Cited

U.S. PATENT DOCUMENTS

| | | | | |
|---|---|---|---|---|
| 5,567,982 A | * | 10/1996 | Bartelink ............ | H10W 20/495 257/664 |
| 5,783,864 A | | 7/1998 | Dawson et al. | |
| 6,423,629 B1 | | 7/2002 | Ahn et al. | |
| 7,056,822 B1 | * | 6/2006 | Zhao ................... | H10W 20/495 438/622 |
| 2002/0142539 A1 | * | 10/2002 | Tu ........................ | H10B 12/485 257/E21.507 |
| 2004/0182603 A1 | * | 9/2004 | Tseng ..................... | H05K 3/462 174/262 |
| 2006/0199368 A1 | * | 9/2006 | Engelhardt ......... | H01L 21/7681 257/773 |

(Continued)

FOREIGN PATENT DOCUMENTS

| | | | | |
|---|---|---|---|---|
| CN | 107408567 A | | 11/2017 | |
| CN | 115472560 A | * | 12/2022 | ....... H01L 21/76895 |

(Continued)

OTHER PUBLICATIONS

Office Action mailed on Oct. 25, 2023 related to Taiwanese Application No. 112120764.

(Continued)

*Primary Examiner* — Brent A. Fairbanks
*Assistant Examiner* — Michael Anguiano
(74) *Attorney, Agent, or Firm* — Xuan Zhang

(57) ABSTRACT

A circuit structure and a method of manufacturing a circuit structure are provided. The circuit structure includes a first metal line and a second metal line. The second metal line is disposed over the first metal line. At least one air gap is disposed between the first metal line and the second metal line.

7 Claims, 33 Drawing Sheets

(56) References Cited

U.S. PATENT DOCUMENTS

| | | | | |
|---|---|---|---|---|
| 2007/0023868 | A1* | 2/2007 | Ho | H10W 20/085 257/621 |
| 2008/0054441 | A1* | 3/2008 | Lin | H01L 21/561 257/793 |
| 2009/0146245 | A1* | 6/2009 | Tischler | H10D 84/40 257/E21.546 |
| 2011/0221034 | A1 | 9/2011 | Kawakita | |
| 2012/0126408 | A1* | 5/2012 | Ernur | H10W 20/072 257/E21.586 |
| 2018/0114729 | A1* | 4/2018 | Lee | H10D 84/0193 |
| 2018/0337743 | A1* | 11/2018 | Jou | G02B 6/4279 |
| 2020/0099012 | A1* | 3/2020 | Zhang | H10K 59/8791 |
| 2021/0305208 | A1* | 9/2021 | Huang | H10W 90/00 |
| 2021/0359106 | A1* | 11/2021 | Sundaresan | H10D 12/031 |

FOREIGN PATENT DOCUMENTS

| | | | |
|---|---|---|---|
| JP | 2009123733 | A | 6/2009 |
| TW | 536811 | B | 6/2003 |
| TW | I722666 | B | 3/2021 |
| TW | 202117872 | A | 5/2021 |

OTHER PUBLICATIONS

Office Action and and the search report mailed on Oct. 23, 2024 related to Taiwanese Application No. 112120764.

Office Action and and the search report mailed on Oct. 30, 2024 related to Taiwanese Application No. 113104706.

Office Action and and the search report mailed on Feb. 25, 2025 related to U.S. Appl. No. 18/380,901.

Office Action and and the search report mailed on Aug. 26, 2025 related to U.S. Appl. No. 18/380,901.

English translation of Abstract of foreign reference CN115472560A.

Office Action and and the search report mailed on May 22, 2025 related to Taiwanese Application No. 112120764.

Office Actions and and the search reports mailed on Jul. 22, 2025 related to Taiwanese Application No. 112120764.

Summary translations of Office Actions and and the search reports mailed on May 22, 2025 and Jul. 22, 2025 related to Taiwanese Application No. 112120764.

Office Action and and the search report mailed on May 23, 2025 related to U.S. Appl. No. 18/380,901.

* cited by examiner

800

| |
|---|
| Providing an assembly structure including a first metal line |
S801

| |
|---|
| Forming a second metal line over the first metal line |
S802

| |
|---|
| Forming at least one air gap between the first metal line and the second metal line |
S803

CIRCUIT STRUCTURE INCLUDING AT LEAST ONE AIR GAP AND METHOD FOR MANUFACTURING THE SAME

TECHNICAL FIELD

The present disclosure relates to a circuit structure and a method for manufacturing a circuit structure, and more particularly, to a circuit structure including at least one air gap.

DISCUSSION OF THE BACKGROUND

In a circuit structure, an upper metal line may be disposed over a lower metal line. An undesired parasitic capacitance may occur between the upper metal line and the lower metal line. Such parasitic capacitance may adversely affect the speed response of the circuit structure. As electronic devices are scaled down and the gap the upper metal line and the lower metal line is getting smaller, signal loss due to parasitic capacitance will become an increasingly critical concern.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a circuit structure. The circuit structure includes a first metal line and a second metal line. The second metal line is disposed over the first metal line. At least one air gap is disposed between the first metal line and the second metal line.

Another aspect of the present disclosure provides a circuit structure. The circuit structure includes a first metal line, a second metal line and a middle structure. The second metal line is disposed over the first metal line. The middle structure is interposed between the first metal line and the second metal line, and is configured to reduce a parasitic capacitance between the first metal line and the second metal line. The middle structure includes three different materials.

Another aspect of the present disclosure provides a method of manufacturing a circuit structure. The method includes: providing an assembly structure including a first metal line; forming a second metal line over the first metal line; and forming at least one air gap between the first metal line and the second metal line.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
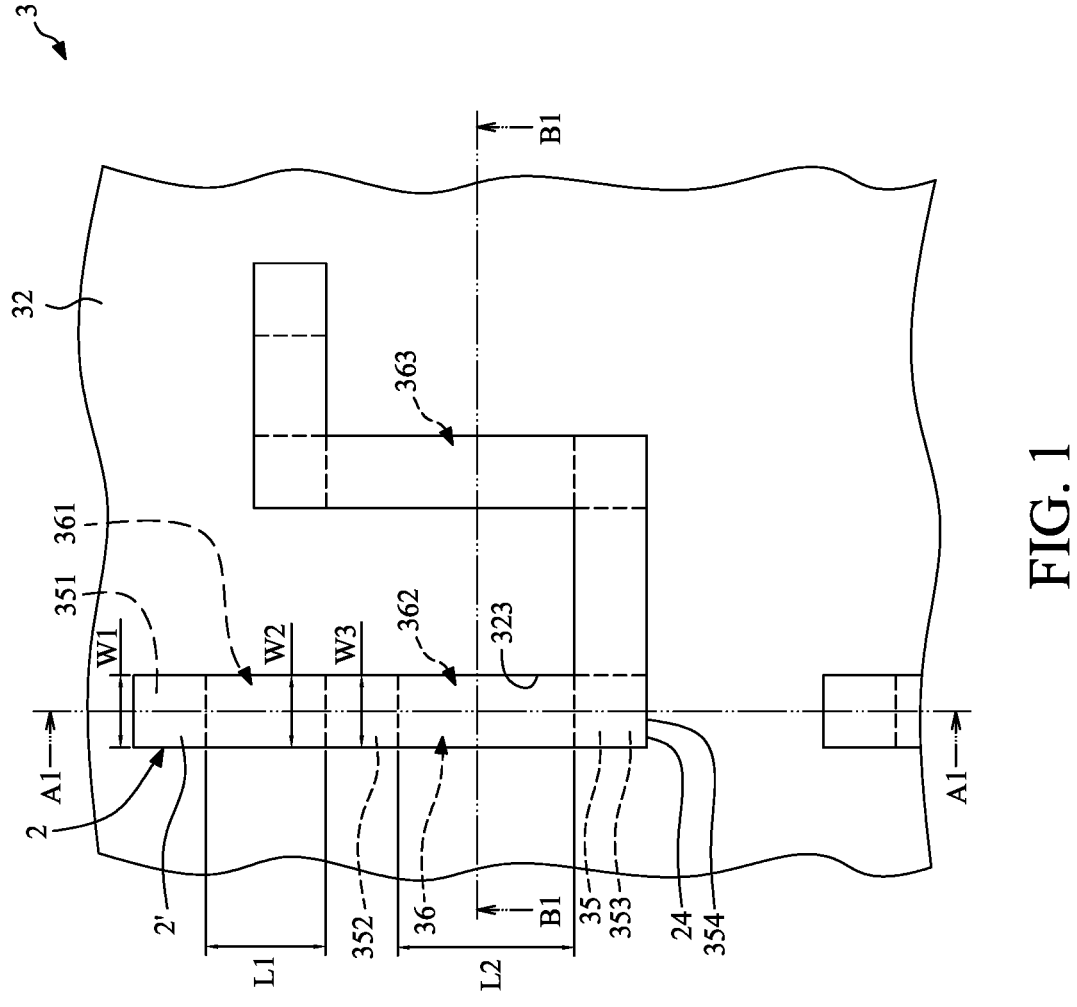
FIG. 1 is a top view of a circuit structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
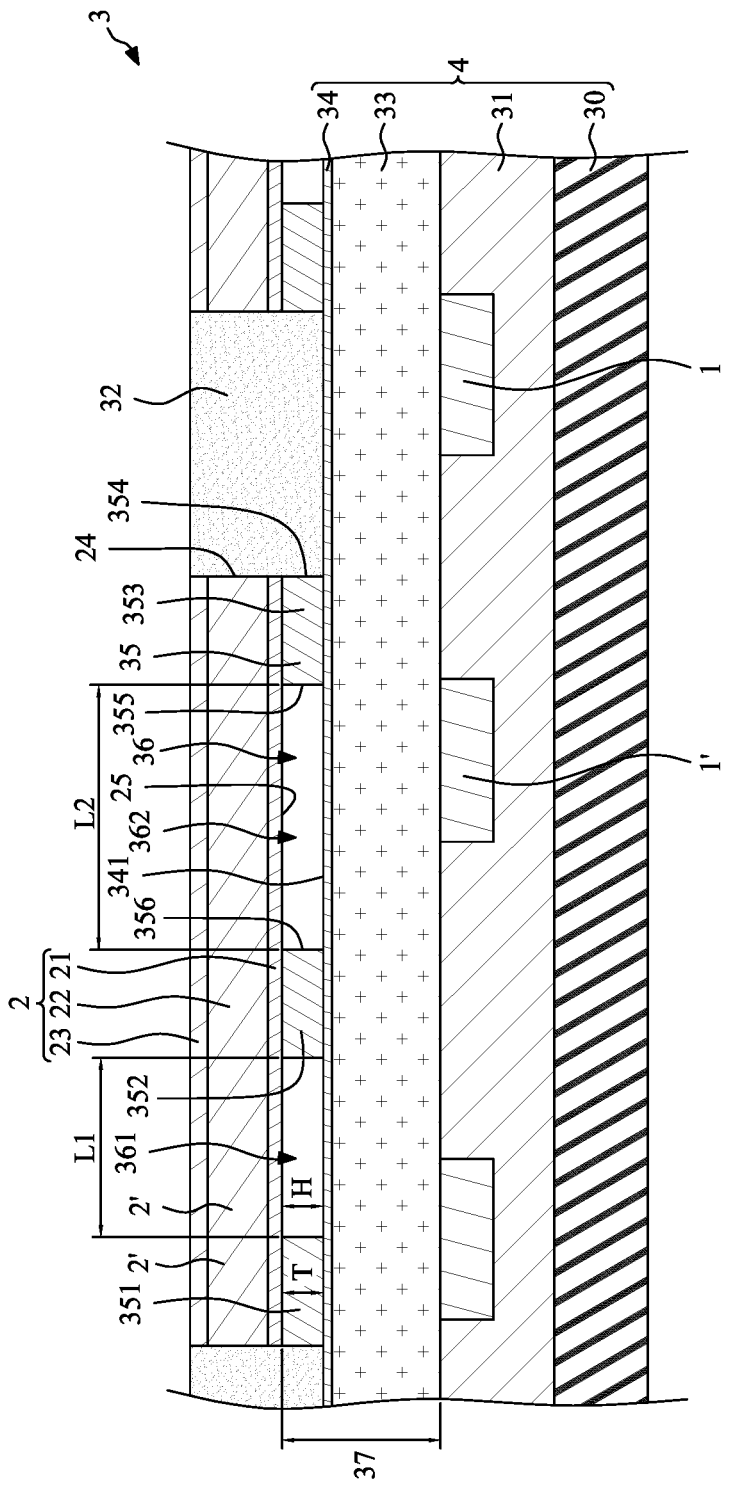
FIG. 2 is a schematic cross-sectional view taken along line A1-A1 of FIG. 1.
Figure 3:
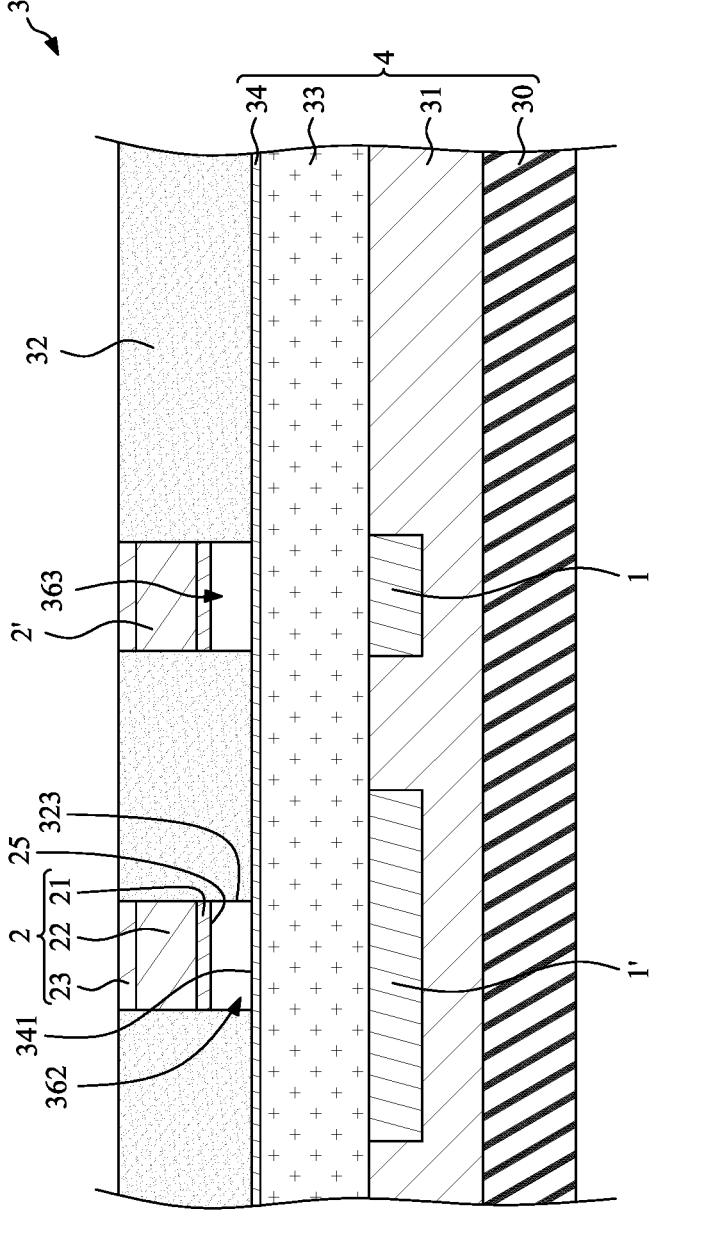
FIG. 3 is a schematic cross-sectional view taken along line B1-B1 of FIG. 1.

FIG. 1 is a top view of a circuit structure 3 in accordance with some embodiments of the present disclosure. FIG. 2 is a schematic cross-sectional view taken along line A1-A1 of FIG. 1. FIG. 3 is a schematic cross-sectional view taken along line B1-B1 of FIG. 1.

The circuit structure 1 may include an assembly structure 4, a plurality of supporting portions 35, at least one air gap 36, a second metal layer 2 and a second dielectric layer 32. In some embodiments, the circuit structure 1 may include a back-end-of-line (BEOL).

The assembly structure 4 may be a base structure, and may include a base layer 30, a first dielectric layer 31, a first metal layer 1, an intermediate dielectric layer 33 and a mask layer 34. The base layer 30 may be a base substrate, and may include semiconductor materials such as silicon, germanium, gallium, arsenic, and combinations thereof. In some embodiments, the base layer 30 may include organic material, glass, ceramic material or the like. For example, the base layer 30 may be made of a cured photoimageable dielectric (PID) material such as epoxy or polyimide (PI) including photoinitiators. For example, the base layer 30 may include a homogeneous material. For example, the material of the base layer 30 may include epoxy type FR5, FR4, Bismaleimide triazine (BT), print circuit board (PCB) material, Prepreg (PP), Ajinomoto build-up film (ABF) or other suitable materials.

The first dielectric layer 31 may be formed or disposed on the base layer 30. A material of the first dielectric layer 31 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof.

The first metal layer 1 may be a patterned circuit layer, and may include a plurality of first metal lines 1'. The first metal layer 1 (including the first metal lines 1') is embedded in the first dielectric layer 31. Thus, the first dielectric layer 31 contacts the first metal layer 1. In some embodiments, a top surface of the first metal layer 1 (including the first metal lines 1') may be aligned with a top surface of the first dielectric layer 31. A material of the first metal layer 1 may include copper (Cu), silver (Ag), aluminum (Al), gold (Au), or an alloy thereof.

The intermediate dielectric layer 33 may be formed or disposed on the first dielectric layer 31 to cover and contact the first dielectric layer 31 and the first metal layer 1 (including the first metal lines 1'). A material of the intermediate dielectric layer 33 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. In some embodiments, the material of the intermediate dielectric layer 33 may be same as the material of the first dielectric layer 31, both are silicon dioxide ($SiO_2$).

The mask layer 34 may be formed or disposed on the intermediate dielectric layer 33 to cover and contact the intermediate dielectric layer 33. The mask layer 34 and the intermediate dielectric layer 33 may be disposed between the first dielectric layer 31 and the second dielectric layer 32. The mask layer 34 may be disposed between the intermediate dielectric layer 33 and the second dielectric layer 32. The mask layer 34 may be a hard mask layer, and a material of the mask layer 34 may include silicon carbide (SiC).

The supporting portions 35 may be formed or disposed on the mask layer 34, and may be spaced apart from each other to define the at least one air gap 36. A material of the supporting portions 35 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. In some embodiments, the material of the supporting portions 35 is silicon nitride ($Si_3N_4$, or SiN). The material of the supporting portions 35 may be different from the material of the mask layer 34.

For example, the supporting portions 35 may include a first supporting portion 351, a second supporting portion 352 and a third supporting portion 353. The air gap 36 may include a first air gap 361, a second air gap 362 and a third air gap 363. The first air gap 361 is defined by or located between the first supporting portion 351 and the second supporting portion 352. The second air gap 362 is defined by or located between the second supporting portion 352 and the third supporting portion 353. The third air gap 363 is defined by or located between another two supporting portions 35.

The second metal layer 2 may be a patterned circuit layer, and may include a plurality of second metal lines 2'. The second metal layer 2 (including the second metal lines 2') may be disposed on the supporting portions 35 and the air gaps 36. Thus, the supporting portions 35 are configured to support and contact the second metal layer 2 (including the second metal lines 2'). The supporting portions 35 are located underneath the second metal layer 2 (including the second metal lines 2'). In some embodiments, the second metal layer 2 (including the second metal lines 2') is disposed over the first metal layer 1 (including the first metal lines 1'), and the at least one air gap 36 is disposed between the first metal layer 1 (including the first metal lines 1') and the second metal layer 2 (including the second metal lines 2').

The second metal layer 2 and the supporting portions 35 are embedded in the second dielectric layer 32. In some embodiments, a top surface of the second metal layer 2 (including the second metal lines 2') may be aligned with a top surface of the second dielectric layer 32. A material of the second metal layer 2 may include a first layer 21, a second layer 22 and a third layer 23 stacked on one another. The first layer 21 may include titanium (Ti). The second layer 22 may include copper (Cu), silver (Ag), aluminum (Al), gold (Au), or an alloy thereof. The third layer 23 may include titanium nitride (TIN). In some embodiments, the first layer 21 and the third layer 23 may be omitted, and the second metal layer 2 may be a single layer. In some embodiments, a first lateral surface 354 of one of the plurality of supporting portions 35 (e.g., the third supporting portion 353) is substantially aligned with a second lateral surface 24 of the second metal layer 2 (including the second metal lines 2').

The second dielectric layer 32 may be formed or disposed on a portion of the mask layer 34 that is not covered by the second metal layer 2 (including the second metal lines 2'). Thus, the second dielectric layer 32 may contact the exposed portion of the mask layer 34, the first lateral surface 354 of the supporting portion 35 and the second lateral surface 24 of the second metal layer 2 (including the second metal lines 2'). The second dielectric layer 32 may be spaced apart from the air gap 36 by the supporting portion 35. The supporting portion 35 and the second metal layer 2 (including the second metal lines 2') are embedded in the second dielectric layer 32. A material of the second dielectric layer 32 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. In some embodiments, the material of the intermediate dielectric layer 33 may be same as the material of the second dielectric layer 32, both are silicon dioxide ($SiO_2$). The material of the second dielectric layer 32 may be different from the material of the mask layer 34.

As shown in FIG. 1 and FIG. 2, the second dielectric layer 32 may not extend into the air gap 36, thus, the air gap 36 is an empty space such as an enclosed empty space. In some embodiments, the second metal line 2', the mask layer 34, the second dielectric layer 32 and the supporting portions 35 collectively define the air gap 36 (e.g., the enclosed empty space). For example, the second air gap 362 is defined by a bottom surface 25 of the second metal line 2', a top surface 341 of the mask layer 34, an inner surface 355 of the third supporting portion 353, an inner surface 356 of the second supporting portion 352, two inner surfaces 323 of the second dielectric layer 32. A portion of the bottom surface 25 of the second metal line 2' is exposed in the air gap 36, e.g., the first air gap 361, the second air gap 362 and the third air gap 363. In addition, in some embodiments, a length L1 of the first air gap 361 may be equal to or different from a length L2 of the second air gap 362 due to the relative positions of the supporting portions 35, e.g., the first supporting portion 351, the second supporting portion 352 and the third supporting portion 353.

As shown in FIG. 1, a first width W1 of the second metal line 2' is substantially equal to a second width W2 of the air gap 36 from the top view. A third width W3 of the supporting portion 35 is substantially equal to the second width W2 of the air gap 36 from the top view. The third width W3 of the supporting portion 35 is substantially equal to the first width W1 of the second metal line 2' from the top view. As shown in FIG. 2, a thickness T of the supporting portion 35 is substantially equal to a height H of the air gap 36, both may be 100 nm to 150 nm. That is, the height H of the air gap 36 may be controlled or adjusted by the thickness T of the supporting portion 35. Thus, the size of the air gap(s) 36 may be controlled or adjusted by the supporting portions 35.

As shown in FIG. 2, the circuit structure 3 may include a middle structure 37 interposed between the first metal layer 1 (including the first metal lines 1') and the second metal layer 2 (including the second metal lines 2'). The middle structure 37 may be configured to reduce a parasitic capacitance between the first metal layer 1 (including the first metal lines 1') and the second metal layer 2 (including the second metal lines 2') since the middle structure 37 defines the air gap 36 (e.g., the enclosed empty space). The dielectric constant of the air is substantially equal to 1, which is relative low.

The middle structure 37 may include three different materials. For example, the middle structure 37 may include the intermediate dielectric layer 33, the mask layer 34 and the supporting portions 35. The mask layer 34 is disposed on the intermediate dielectric layer 33, the supporting portions 35 are disposed on the mask layer 34. Alternatively, the middle structure 37 may include the intermediate dielectric layer 33, the mask layer 34 and the air gap 36.

FIG. 4 to FIG. 32 illustrate stages of a method of manufacturing a circuit structure in accordance with some embodiments of the present disclosure. At least some of these figures have been simplified for a better understanding of the aspects of the present disclosure. In some embodiments, the circuit structure 3 in FIG. 1 to FIG. 3 may be manufactured by the operations described below with respect to FIG. 4 to FIG. 32.

Figure 4:
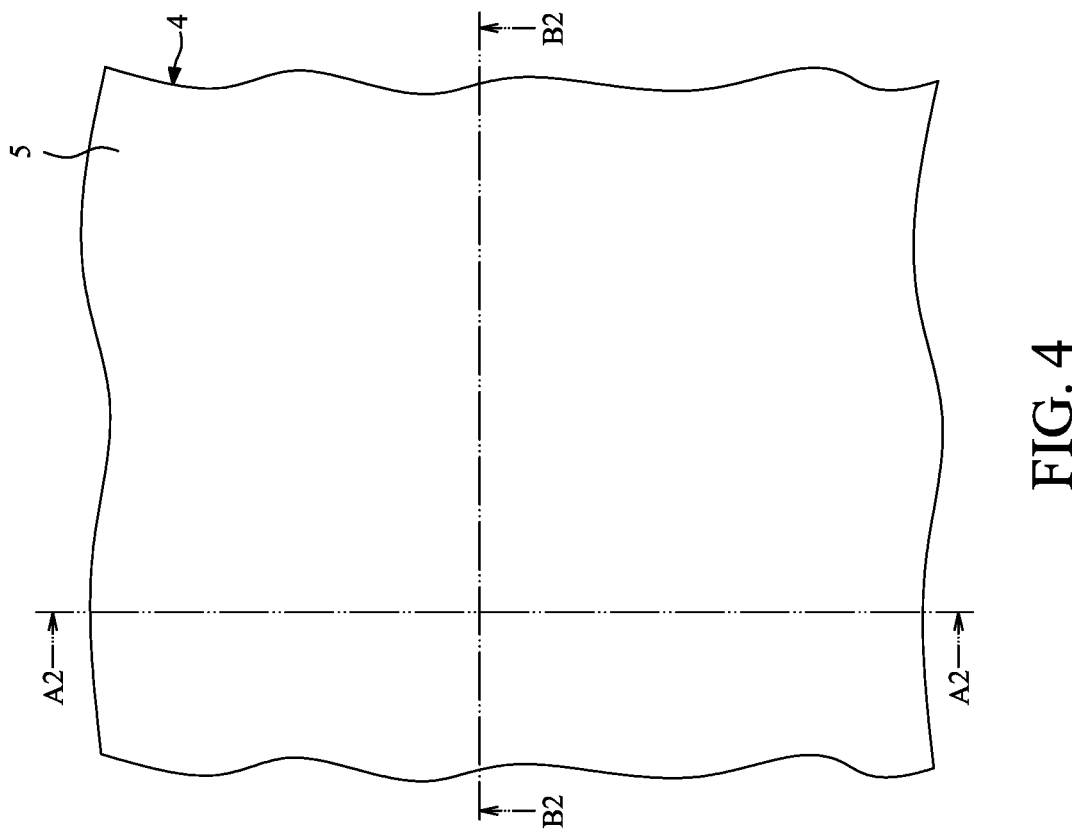
FIG. 4 illustrates one or more stages of a method of manufacturing a circuit structure in accordance with some embodiments of the present disclosure.
Figure 5:
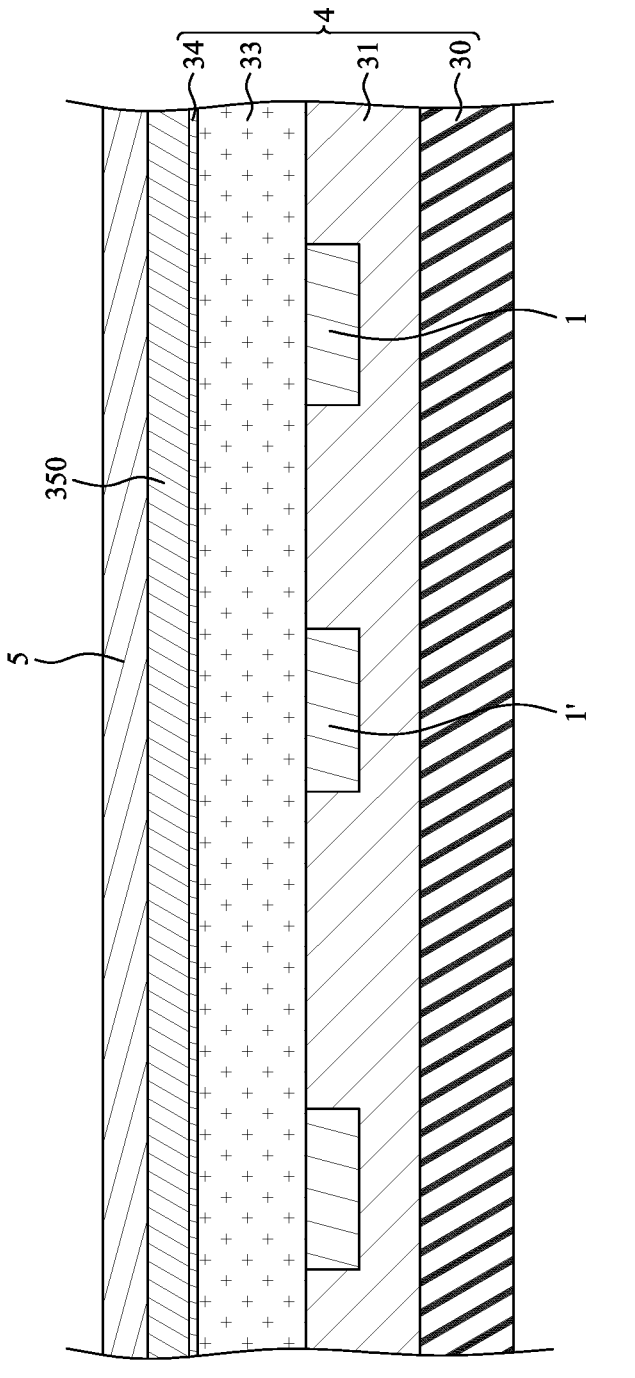
FIG. 5 is a schematic cross-sectional view taken along line A2-A2 of FIG. 4.
Figure 6:
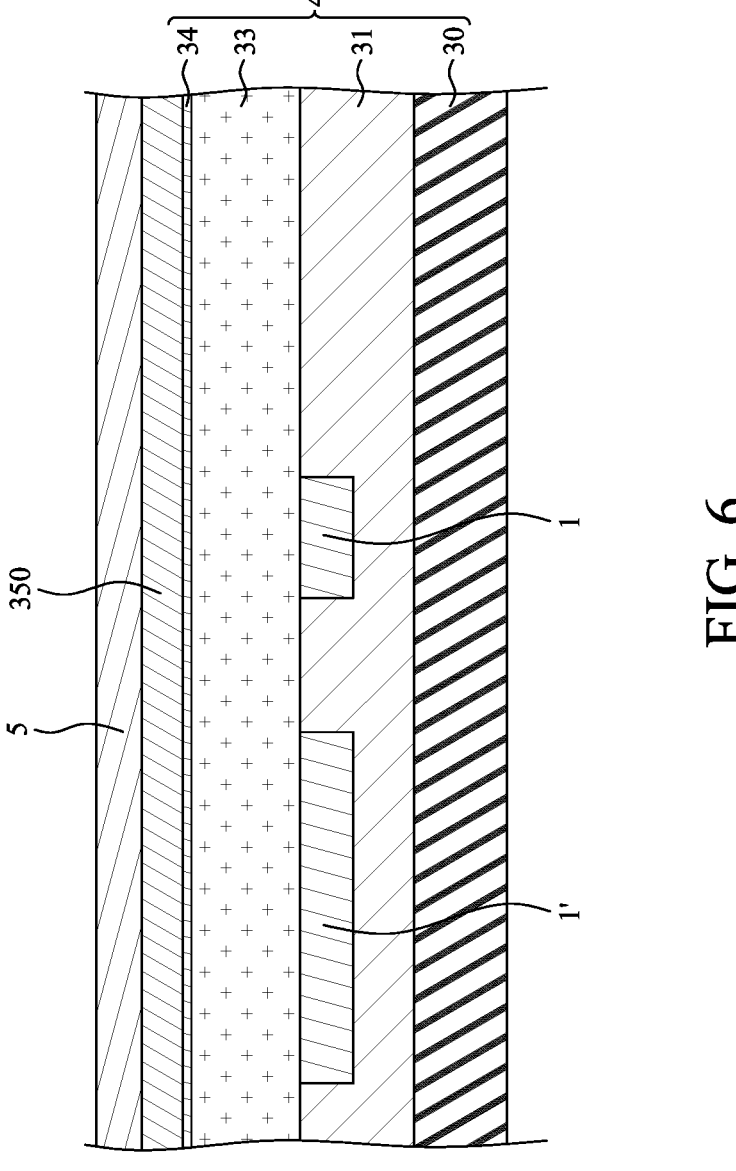
FIG. 6 is a schematic cross-sectional view taken along line B2-B2 of FIG. 4.

Referring to FIG. 4 to FIG. 6, wherein FIG. 5 is a schematic cross-sectional view taken along line A2-A2 of FIG. 4, FIG. 6 is a schematic cross-sectional view taken along line B2-B2 of FIG. 4, an assembly structure 4 may be provided. The assembly structure 4 may include a base layer 30, a first dielectric layer 31, a first metal layer 1, an intermediate dielectric layer 33 and a mask layer 34. The base layer 30 may be a base substrate, and may include semiconductor materials such as silicon, germanium, gallium, arsenic, and combinations thereof. In some embodiments, the base layer 30 may include organic material, glass, ceramic material or the like. For example, the base layer 30 may be made of a cured photoimageable dielectric (PID) material such as epoxy or polyimide (PI) including photoinitiators. For example, the base layer 30 may include a homogeneous material. For example, the material of the base layer 30 may include epoxy type FR5, FR4, Bismaleimide triazine (BT), print circuit board (PCB) material, Prepreg (PP), Ajinomoto build-up film (ABF) or other suitable materials.

The first dielectric layer 31 may be formed or disposed on the base layer 30. A material of the first dielectric layer 31 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof.

The first metal layer 1 may be a patterned circuit layer, and may include a plurality of first metal lines 1'. The first metal layer 1 (including the first metal lines 1') is embedded in the first dielectric layer 31. Thus, the first dielectric layer 31 contacts the first metal layer 1. In some embodiments, a top surface of the first metal layer 1 (including the first metal lines 1') may be aligned with a top surface of the first dielectric layer 31. A material of the first metal layer 1 may include copper (Cu), silver (Ag), aluminum (Al), gold (Au), or an alloy thereof.

The intermediate dielectric layer 33 may be formed or disposed on the first dielectric layer 31 to cover and contact the first dielectric layer 31 and the first metal layer 1 (including the first metal lines 1'). A material of the intermediate dielectric layer 33 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. In some embodiments, the material of the intermediate dielectric layer 33 may be same as the material of the first dielectric layer 31, both are silicon dioxide ($SiO_2$).

The mask layer 34 may be formed or disposed on the intermediate dielectric layer 33 to cover and contact the intermediate dielectric layer 33. The mask layer 34 and the intermediate dielectric layer 33 may be disposed between the first dielectric layer 31 and the second dielectric layer 32. The mask layer 34 may be disposed between the intermediate dielectric layer 33 and the second dielectric layer 32. The mask layer 34 may be a hard mask layer, and a material of the mask layer 34 may include silicon carbide (SiC).

Then, a supporting layer 350 may be formed or disposed on the assembly structure 4 to cover the mask layer 34. A material of the supporting layer 350 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. In some embodiments, the material of the supporting layer 350 is silicon nitride ($Si_3N_4$, or SiN). The material of the supporting layer 350 may be different from the material of the mask layer 34.

Then, a photoresist layer 5 may be formed or disposed on the supporting layer 350.

Figure 7:
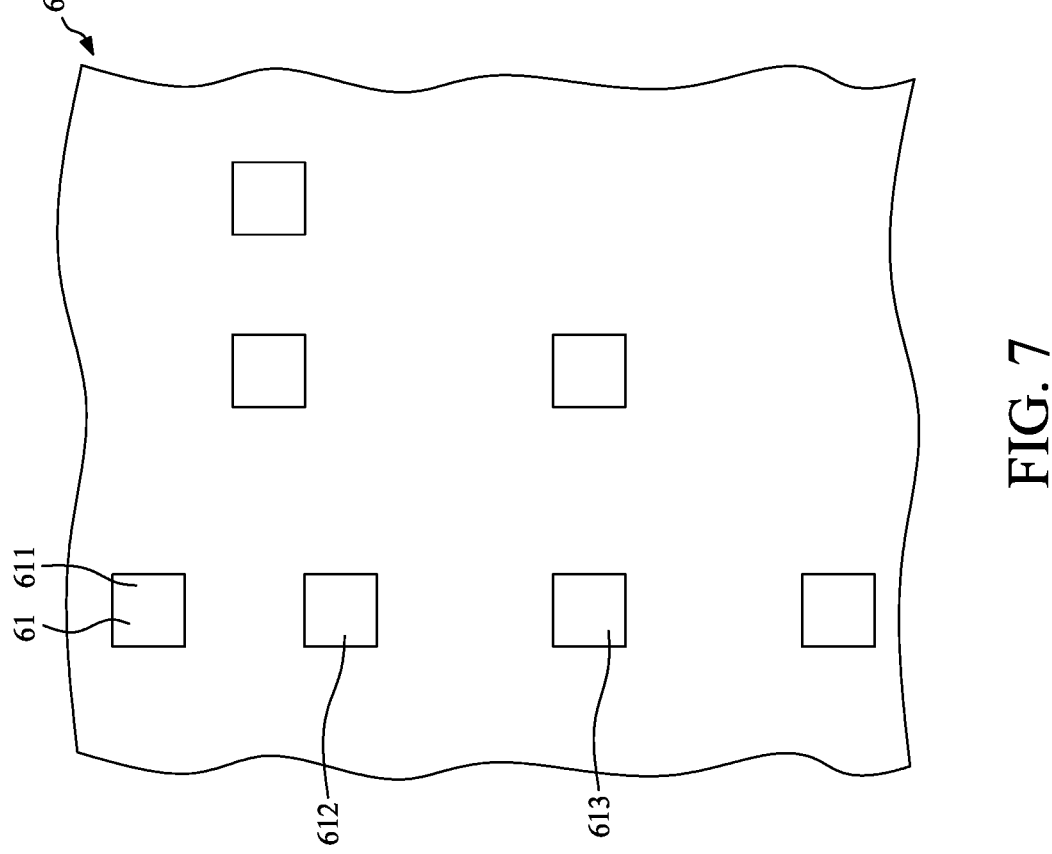
FIG. 7 illustrates one or more stages of a method of manufacturing a circuit structure in accordance with some embodiments of the present disclosure.

Referring to FIG. 7, a photomask 6 may be provided. The photomask 6 may include a pattern 61. The pattern 61 may include a plurality of predetermined areas 611, 612, 613.

Figure 8:
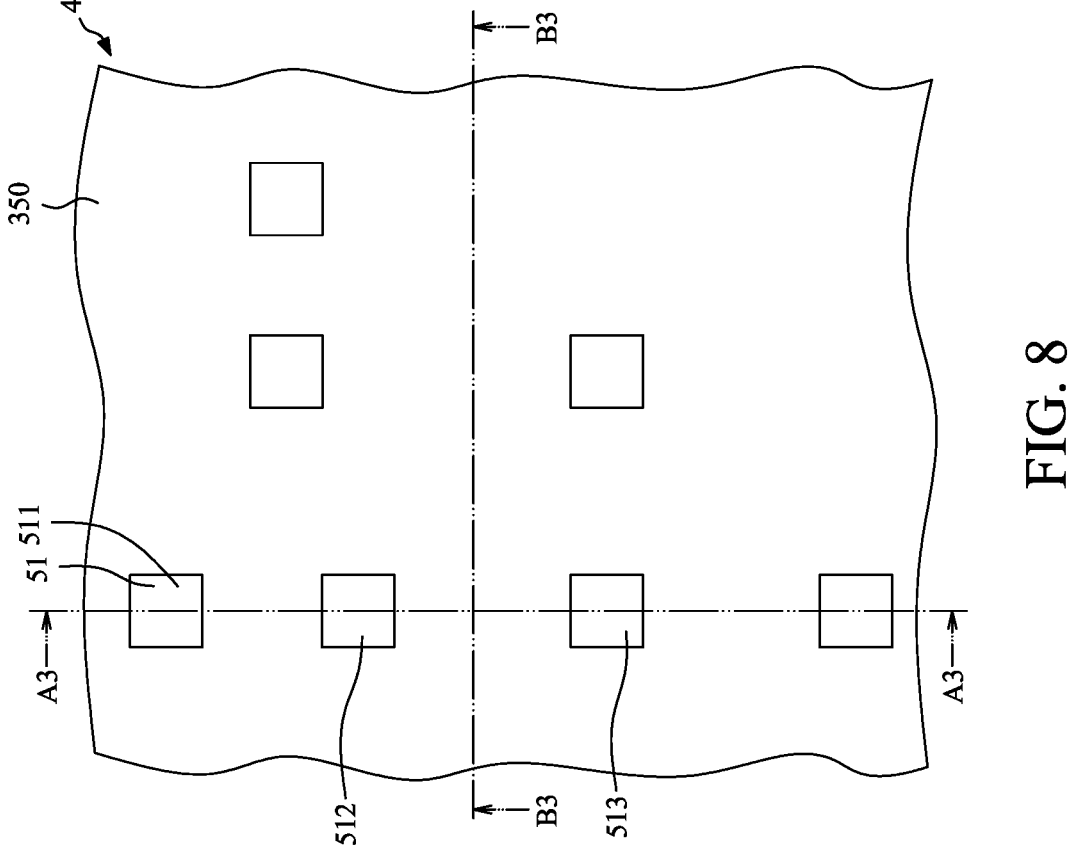
FIG. 8 illustrates one or more stages of a method of manufacturing a circuit structure in accordance with some embodiments of the present disclosure.
Figure 9:
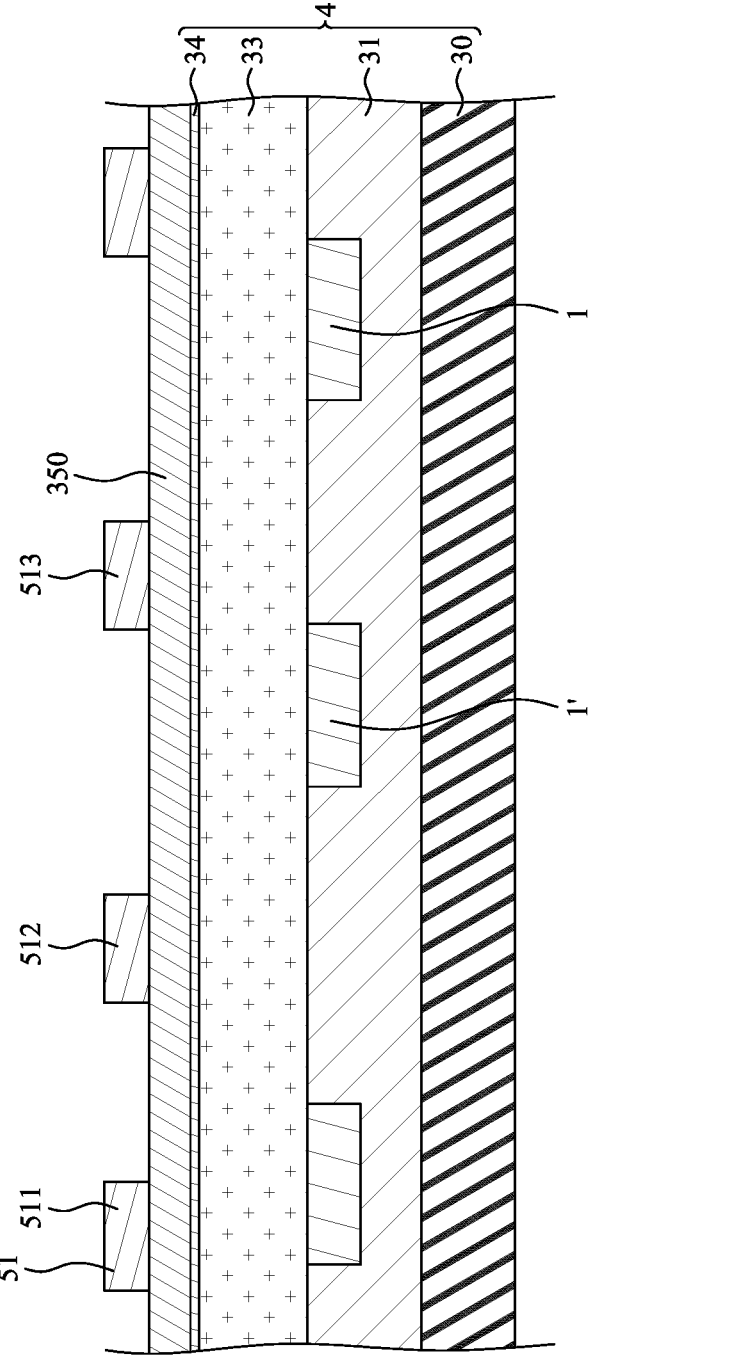
FIG. 9 is a schematic cross-sectional view taken along line A3-A3 of FIG. 8.
Figure 10:
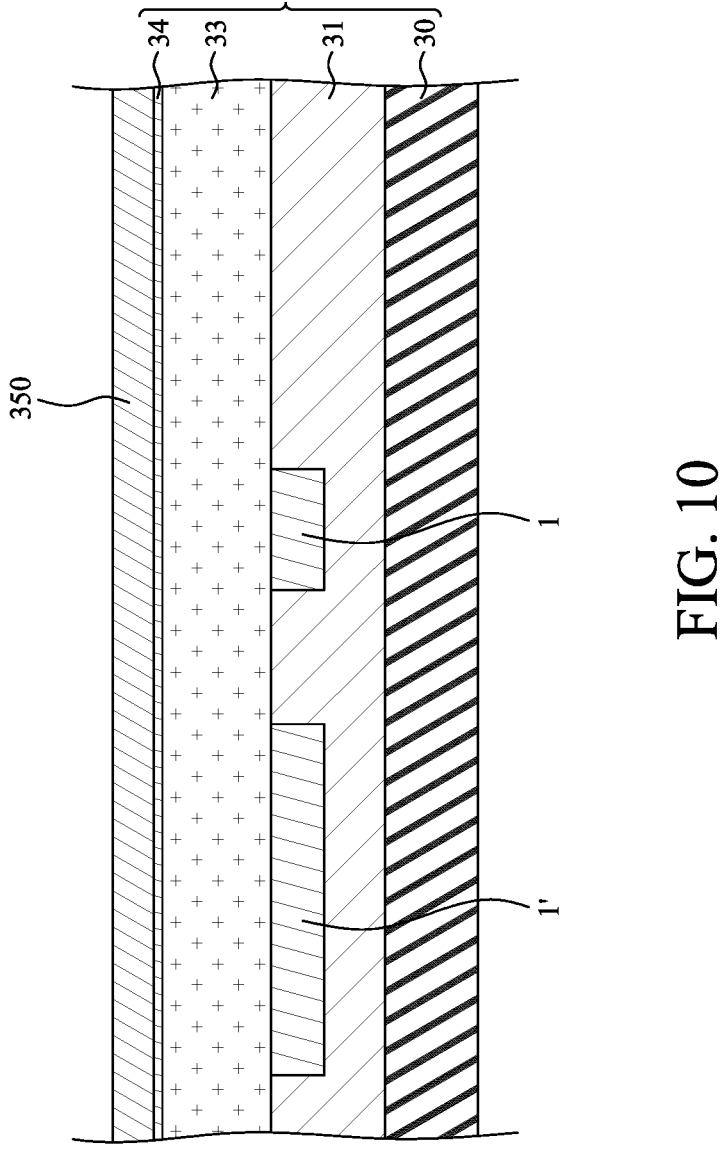
FIG. 10 is a schematic cross-sectional view taken along line B3-B3 of FIG. 8.

Referring to FIG. 8 to FIG. 10, wherein FIG. 9 is a schematic cross-sectional view taken along line A3-A3 of FIG. 8, FIG. 10 is a schematic cross-sectional view taken along line B3-B3 of FIG. 8, the photoresist layer 5 may be patterned to form a pattern 51 by using the photomask 6. The pattern 51 may include plurality of remaining portions such as remaining portions 511, 512, 513. The remaining portions 511, 512, 513 may correspond to the predetermined areas 611, 612, 613 of the photomask 6, respectively. Meanwhile, a portion of the supporting layer 350 is exposed.

Figure 11:
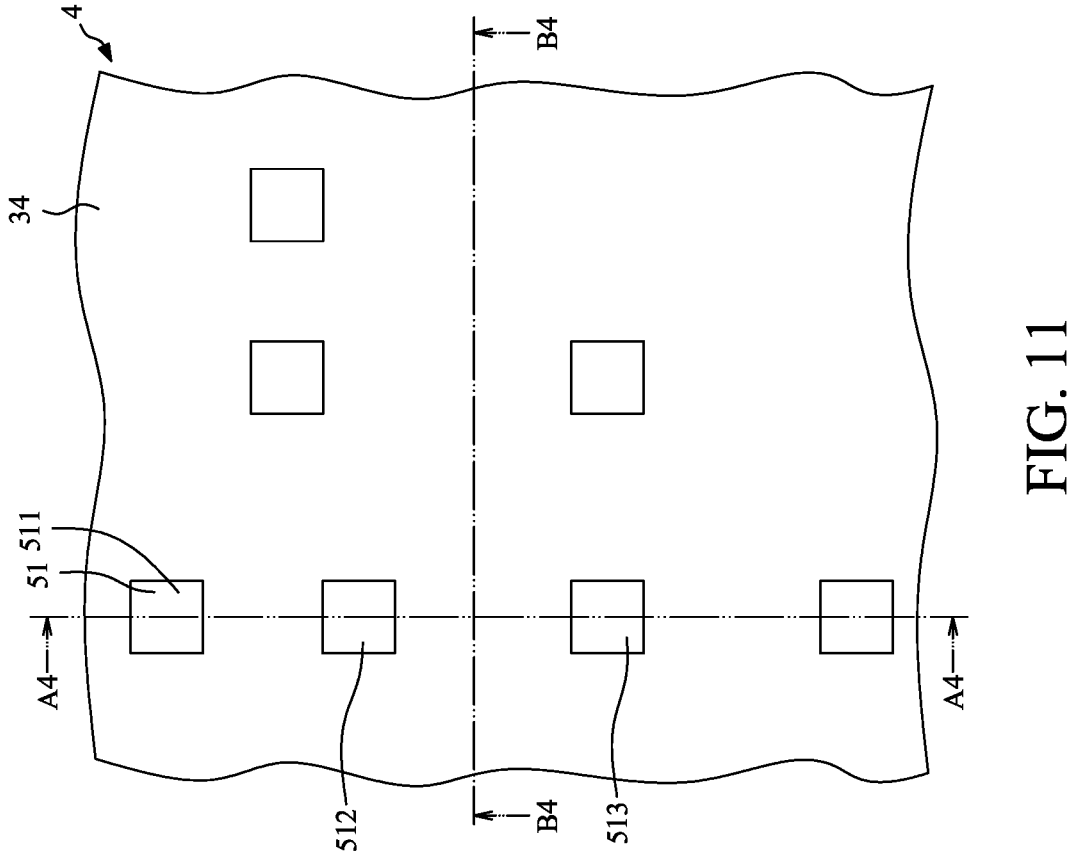
FIG. 11 illustrates one or more stages of a method of manufacturing a circuit structure in accordance with some embodiments of the present disclosure.
Figure 12:
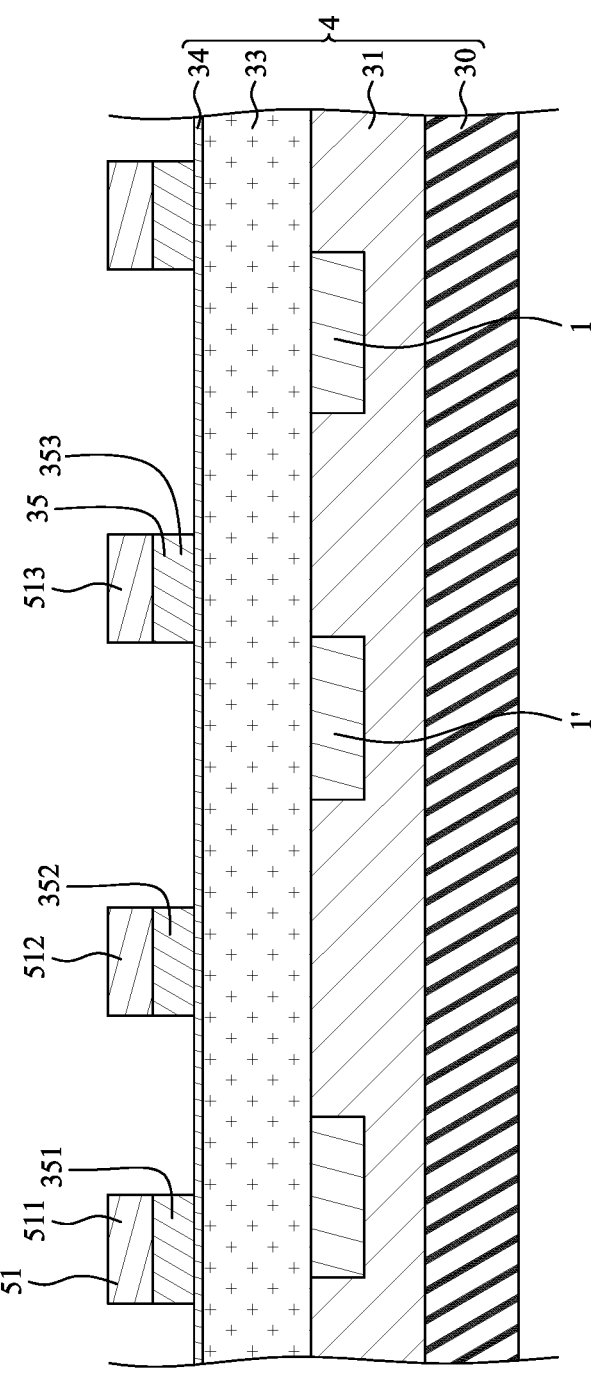
FIG. 12 is a schematic cross-sectional view taken along line A4-A4 of FIG. 11.
Figure 13:
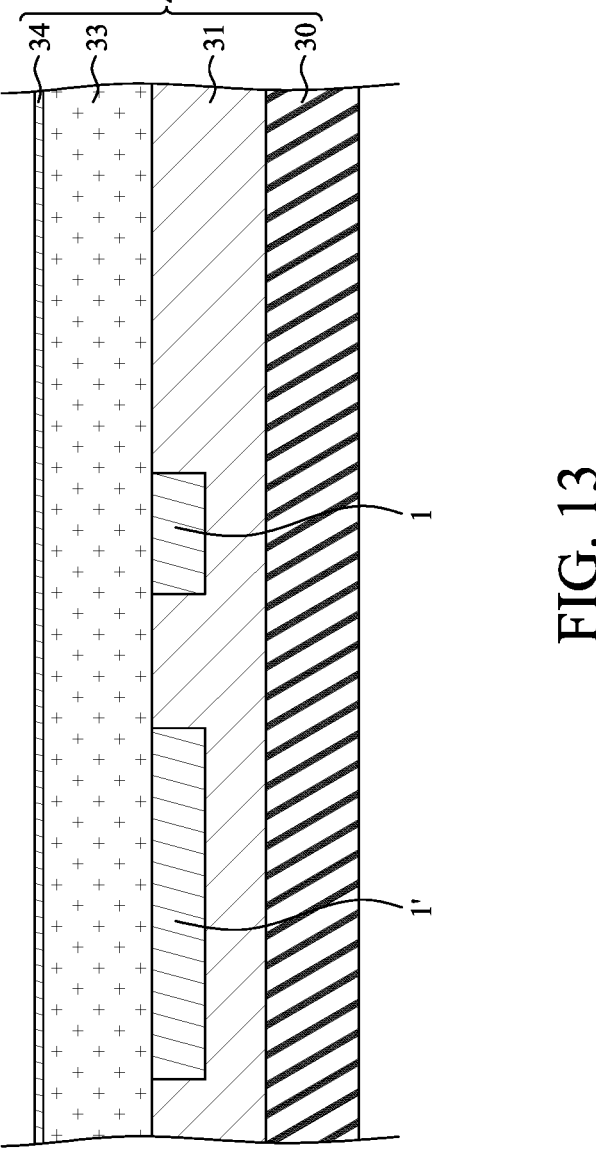
FIG. 13 is a schematic cross-sectional view taken along line B4-B4 of FIG. 11.

Referring to FIG. 11 to FIG. 13, wherein FIG. 12 is a schematic cross-sectional view taken along line A4-A4 of FIG. 11, FIG. 13 is a schematic cross-sectional view taken along line B4-B4 of FIG. 11, the supporting layer 350 may be patterned to form a plurality of supporting portions 35 by using the patterned pattern 51 of the photoresist layer 5. For example, the exposed portion of the supporting layer 350 may be etched by using the remaining portions (e.g., the remaining portions 511, 512, 513) as a mask. For example, the supporting portions 35 may include a first supporting portion 351, a second supporting portion 352 and a third supporting portion 353 that correspond to the remaining portions 511, 512, 513, respectively. Meanwhile, a portion of the mask layer 34 is exposed.

Figure 14:
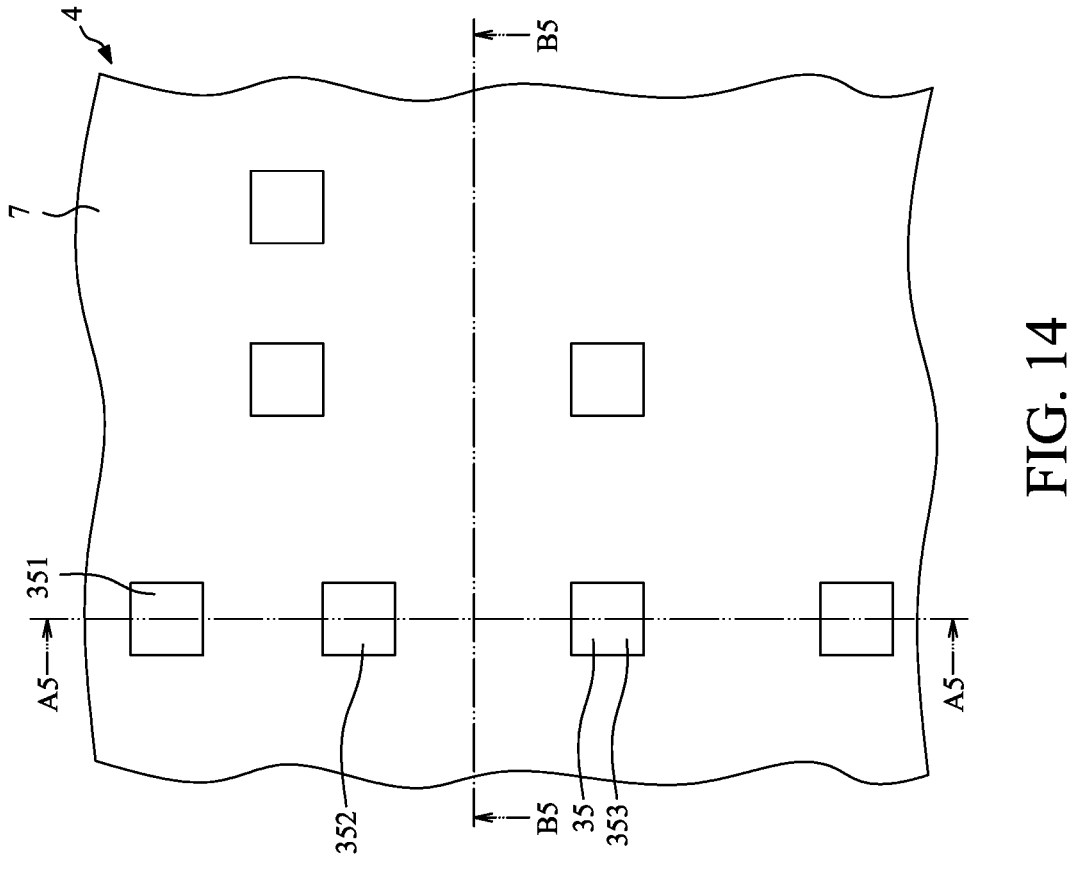
FIG. 14 illustrates one or more stages of a method of manufacturing a circuit structure in accordance with some embodiments of the present disclosure.
Figure 15:
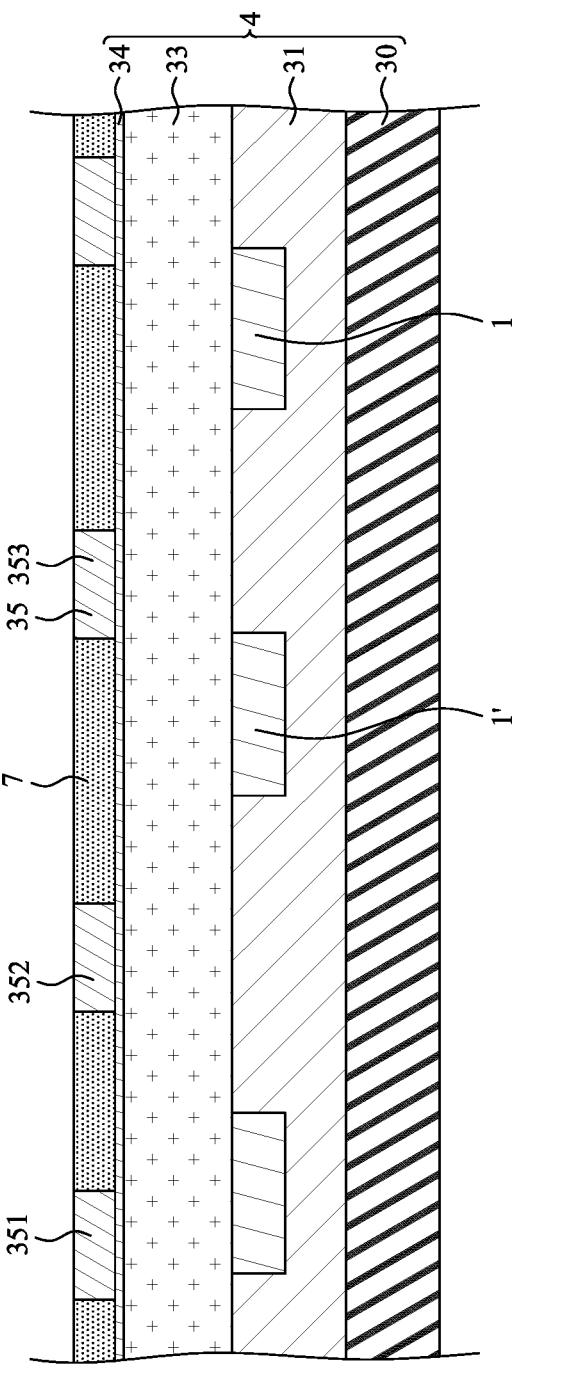
FIG. 15 is a schematic cross-sectional view taken along line A5-A5 of FIG. 14.
Figure 16:
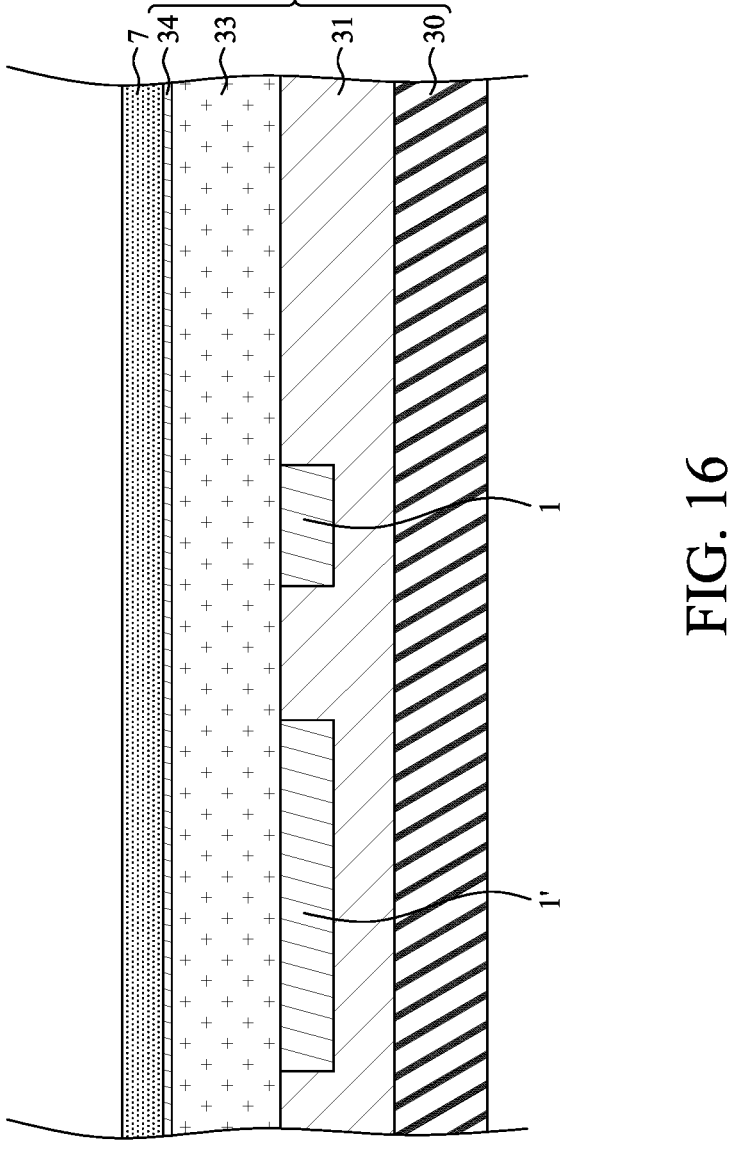
FIG. 16 is a schematic cross-sectional view taken along line B5-B5 of FIG. 14.

Referring to FIG. 14 to FIG. 16, wherein FIG. 15 is a schematic cross-sectional view taken along line A5-A5 of FIG. 14, FIG. 16 is a schematic cross-sectional view taken along line B5-B5 of FIG. 14, the photoresist layer 5 (e.g., the remaining portions 511, 512, 513) may be removed by stripping. Then, a filling material 7 may be formed or disposed between the supporting portions 35 to cover the exposed portion of the mask layer 34 by deposition. A material of the filling material 7 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide ($BaSrTiO_3$, BST), or a combination thereof. In some embodiments, the material of the filling material 7 may be same as the material of the intermediate dielectric layer 33, both are silicon dioxide ($SiO_2$). In some embodiments, a planarization process (e.g., chemical mechanical polishing, CMP) may be conducted so that the top surface of the filling material 7 may be aligned with or coplanar with the top surfaces of the supporting portions 35.

Figure 17:
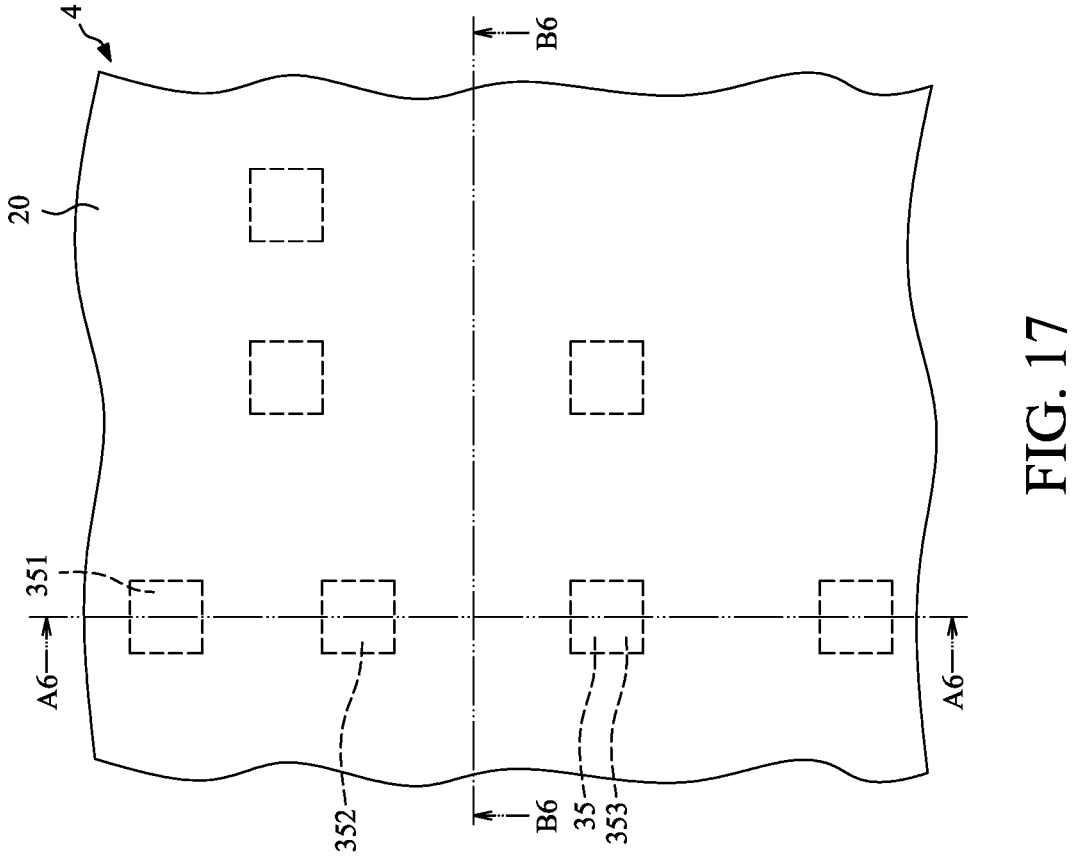
FIG. 17 illustrates one or more stages of a method of manufacturing a circuit structure in accordance with some embodiments of the present disclosure.
Figure 18:
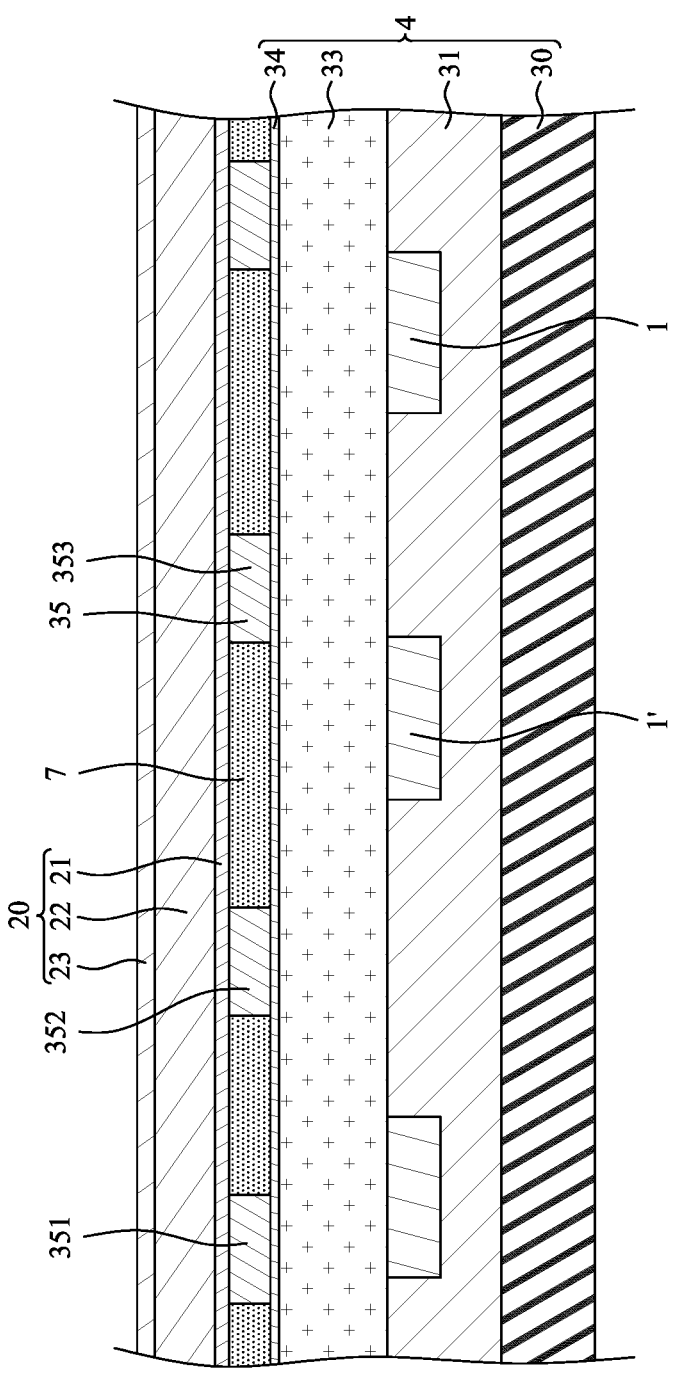
FIG. 18 is a schematic cross-sectional view taken along line A6-A6 of FIG. 17.
Figure 19:
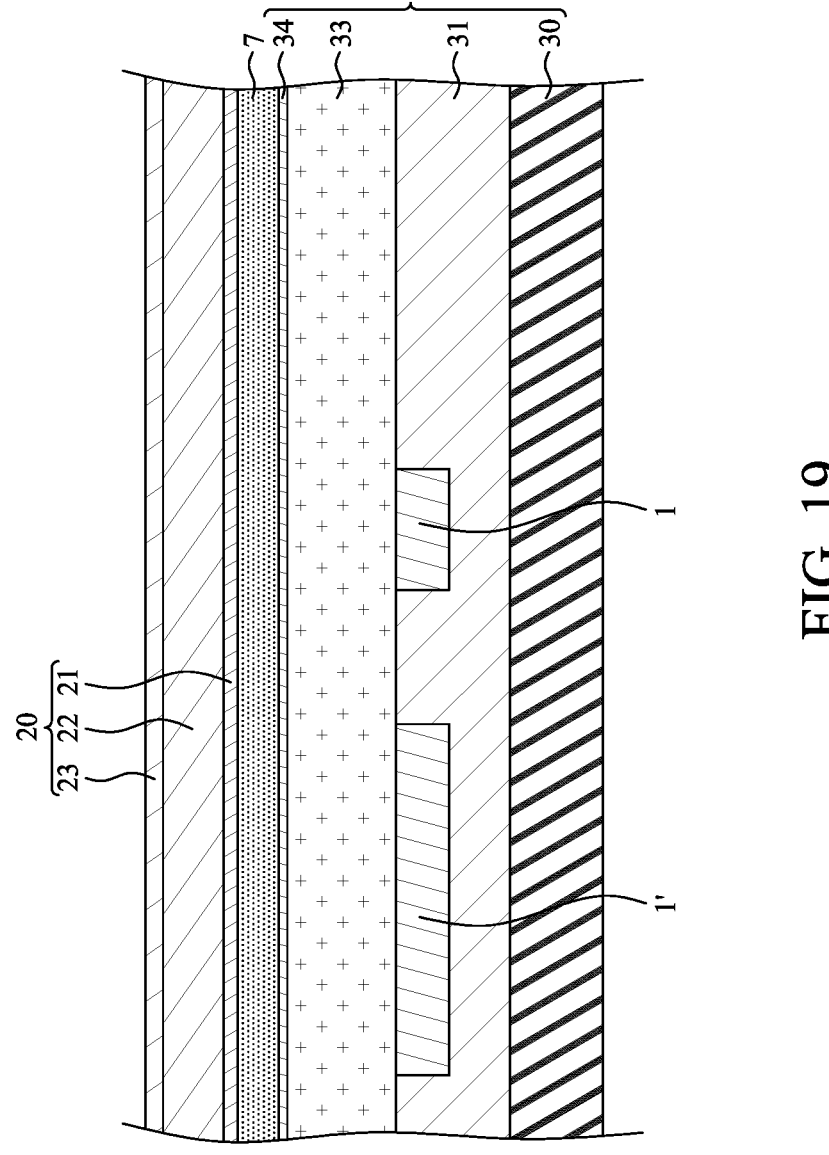
FIG. 19 is a schematic cross-sectional view taken along line B6-B6 of FIG. 17.

Referring to FIG. 17 to FIG. 19, wherein FIG. 18 is a schematic cross-sectional view taken along line A6-A6 of FIG. 17, FIG. 19 is a schematic cross-sectional view taken along line B6-B6 of FIG. 17, a conductive metal structure 20 may be formed or disposed on the filling material 7 and the supporting portions 35. A material of the conductive metal structure 20 may include a first layer 21, a second layer 22 and a third layer 23 stacked on one another. The first layer 21 may include titanium (Ti). The second layer 22 may include copper (Cu), silver (Ag), aluminum (Al), gold (Au), or an alloy thereof. The third layer 23 may include titanium nitride (TIN). In some embodiments, the first layer 21 and the third layer 23 may be omitted, and the conductive metal structure 20 may be a single layer.

Figure 20:
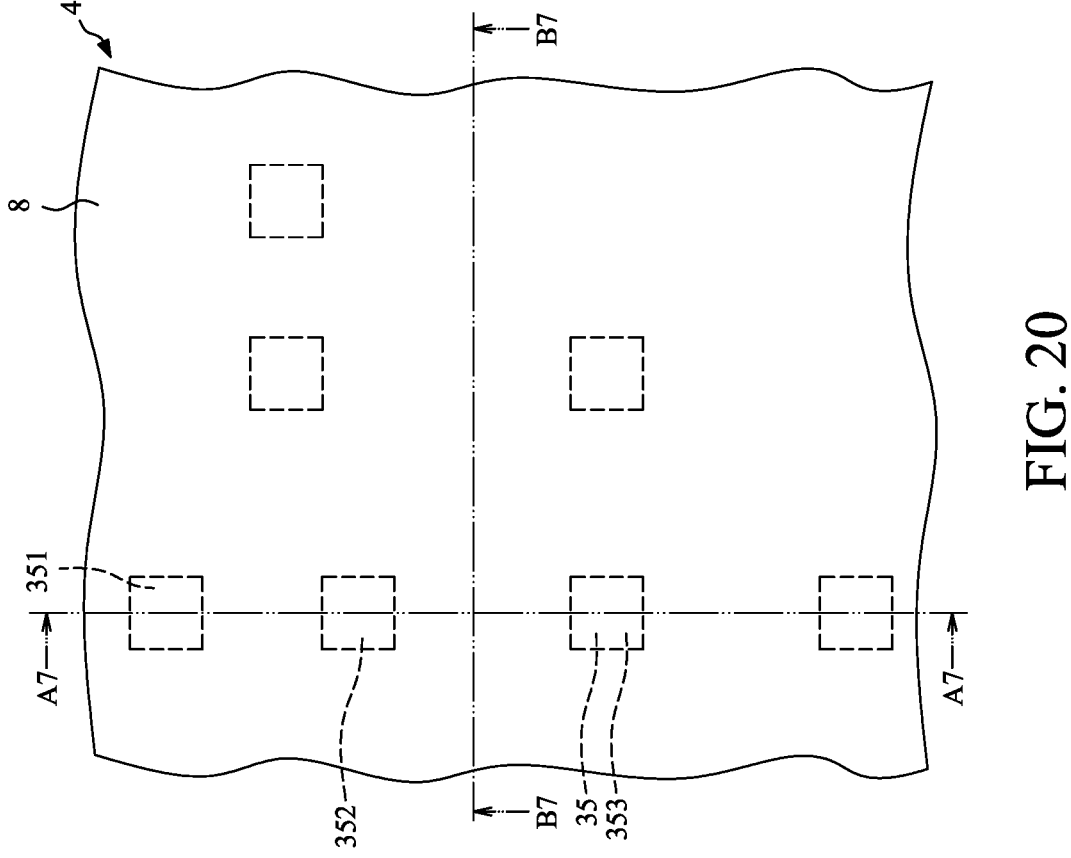
FIG. 20 illustrates one or more stages of a method of manufacturing a circuit structure in accordance with some embodiments of the present disclosure.
Figure 21:
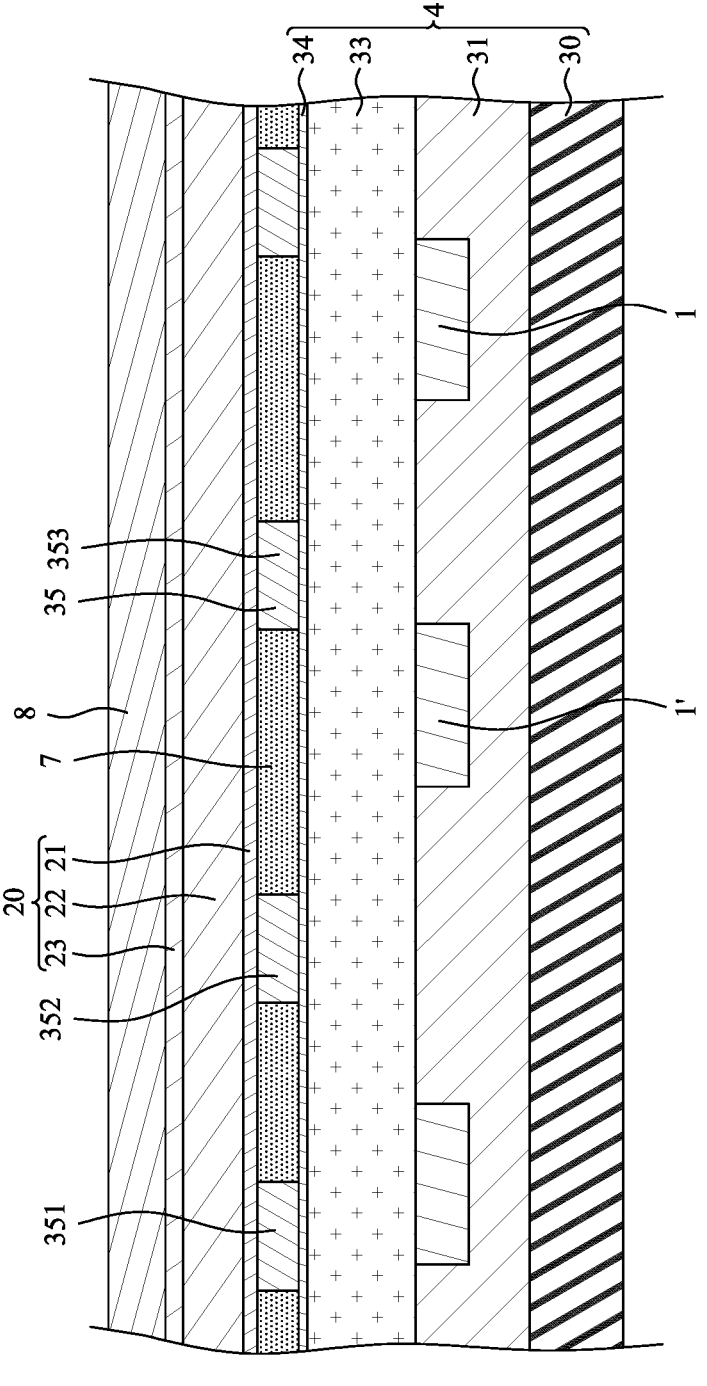
FIG. 21 is a schematic cross-sectional view taken along line A7-A7 of FIG. 20.
Figure 22:
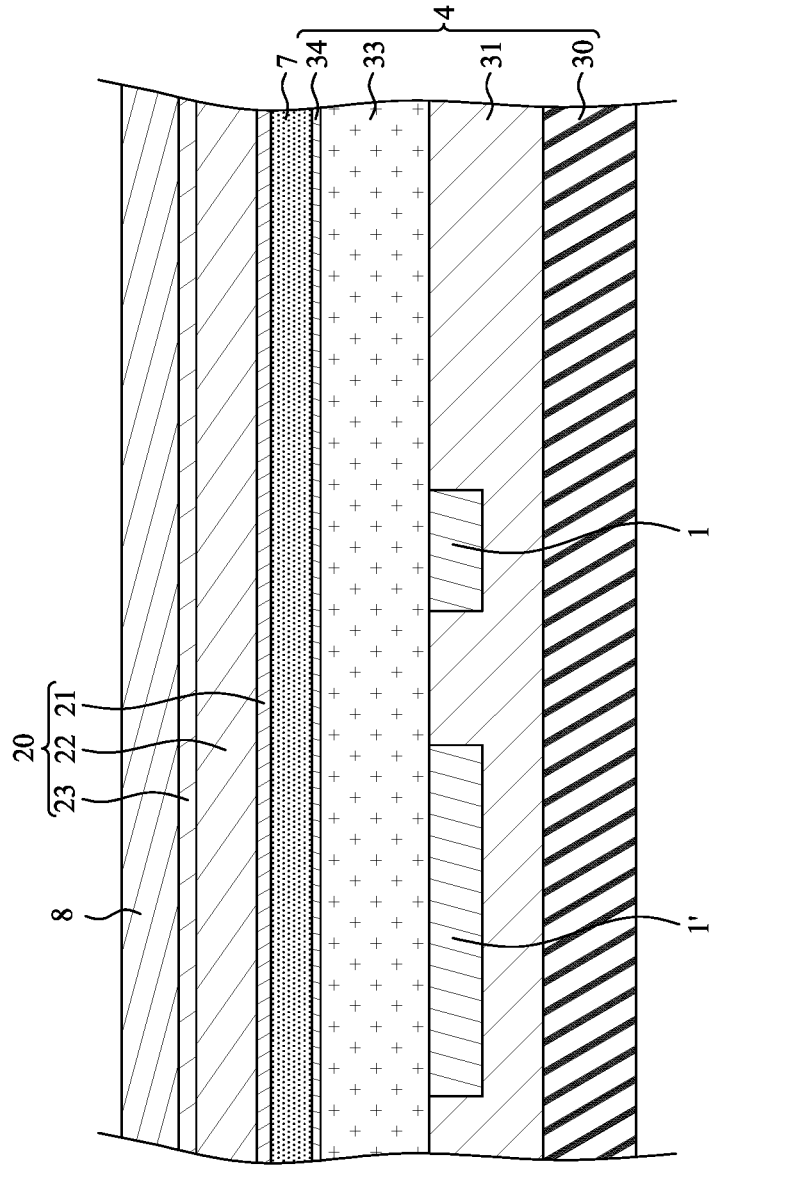
FIG. 22 is a schematic cross-sectional view taken along line B7-B7 of FIG. 20.

Referring to FIG. 20 to FIG. 22, wherein FIG. 21 is a schematic cross-sectional view taken along line A7-A7 of FIG. 20, FIG. 22 is a schematic cross-sectional view taken along line B7-B7 of FIG. 20, a photoresist layer 8 may be formed or disposed on the conductive metal structure 20.

Figure 23:
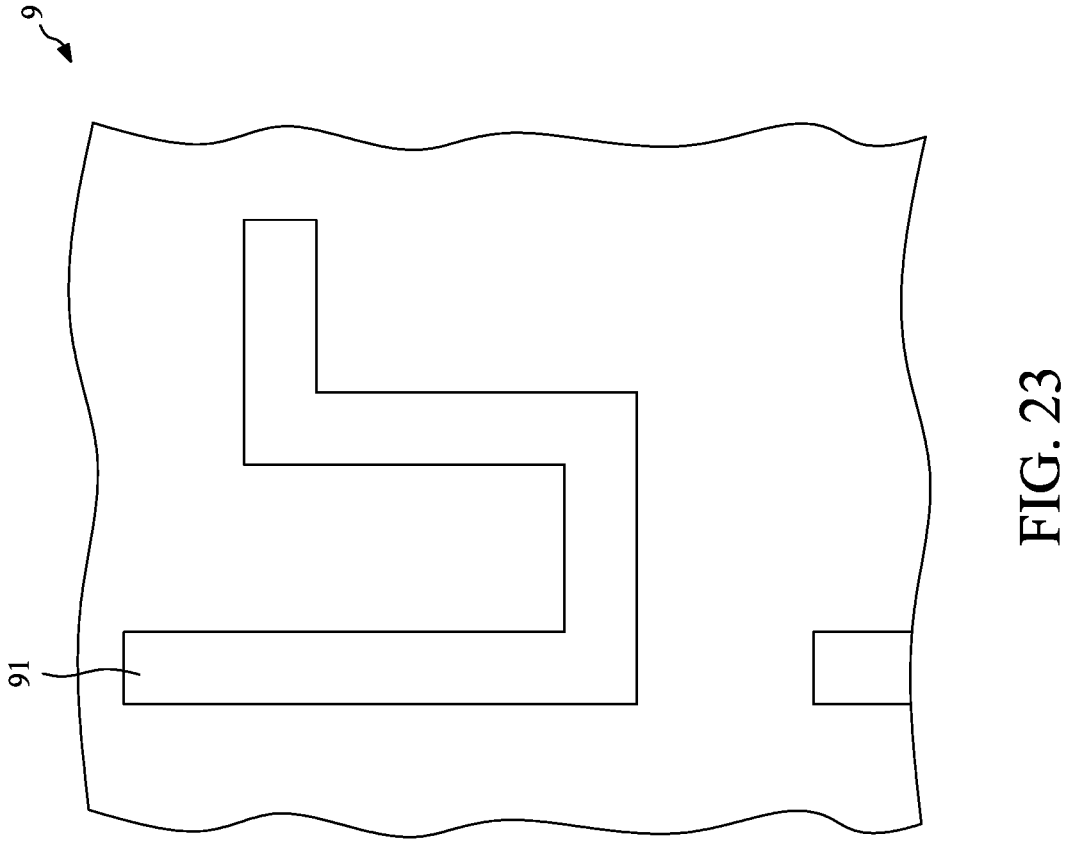
FIG. 23 illustrates one or more stages of a method of manufacturing a circuit structure in accordance with some embodiments of the present disclosure.

Referring to FIG. 23, a photomask 9 may be provided. The photomask 9 may include a pattern 91. The pattern 91 may include a plurality of predetermined areas such as segments or lines.

Figure 24:
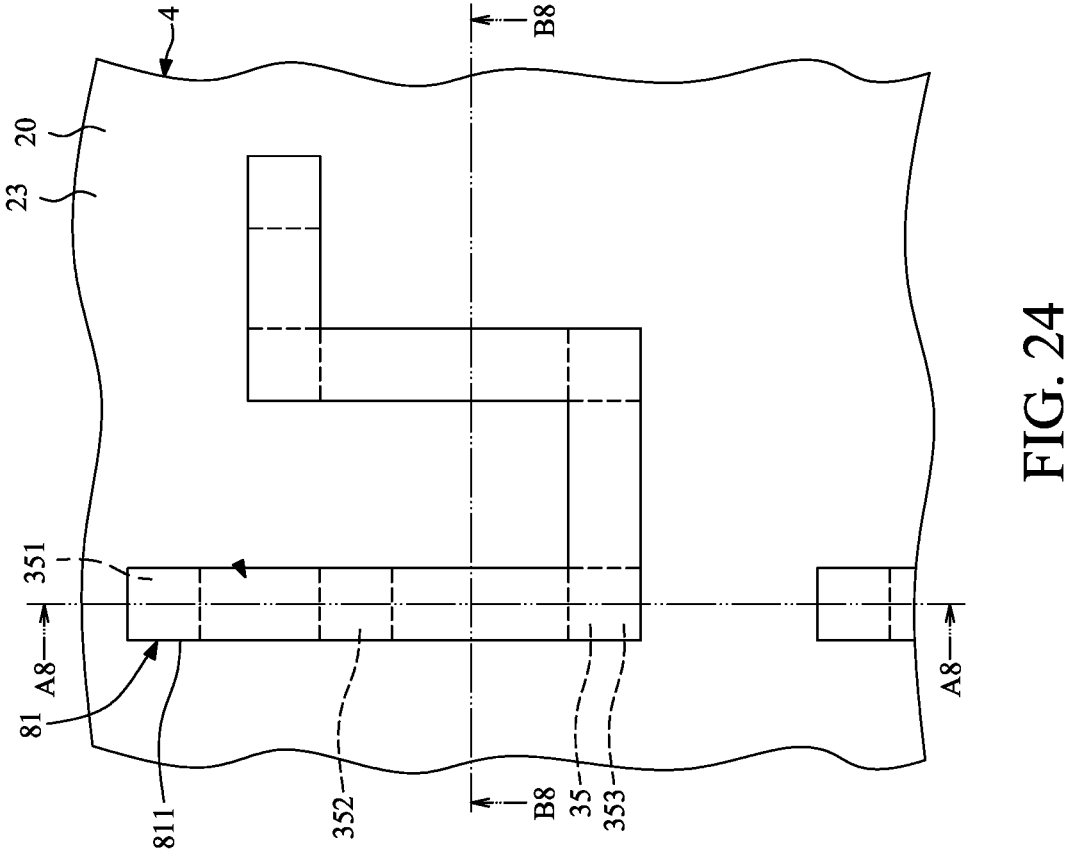
FIG. 24 illustrates one or more stages of a method of manufacturing a circuit structure in accordance with some embodiments of the present disclosure.
Figure 25:
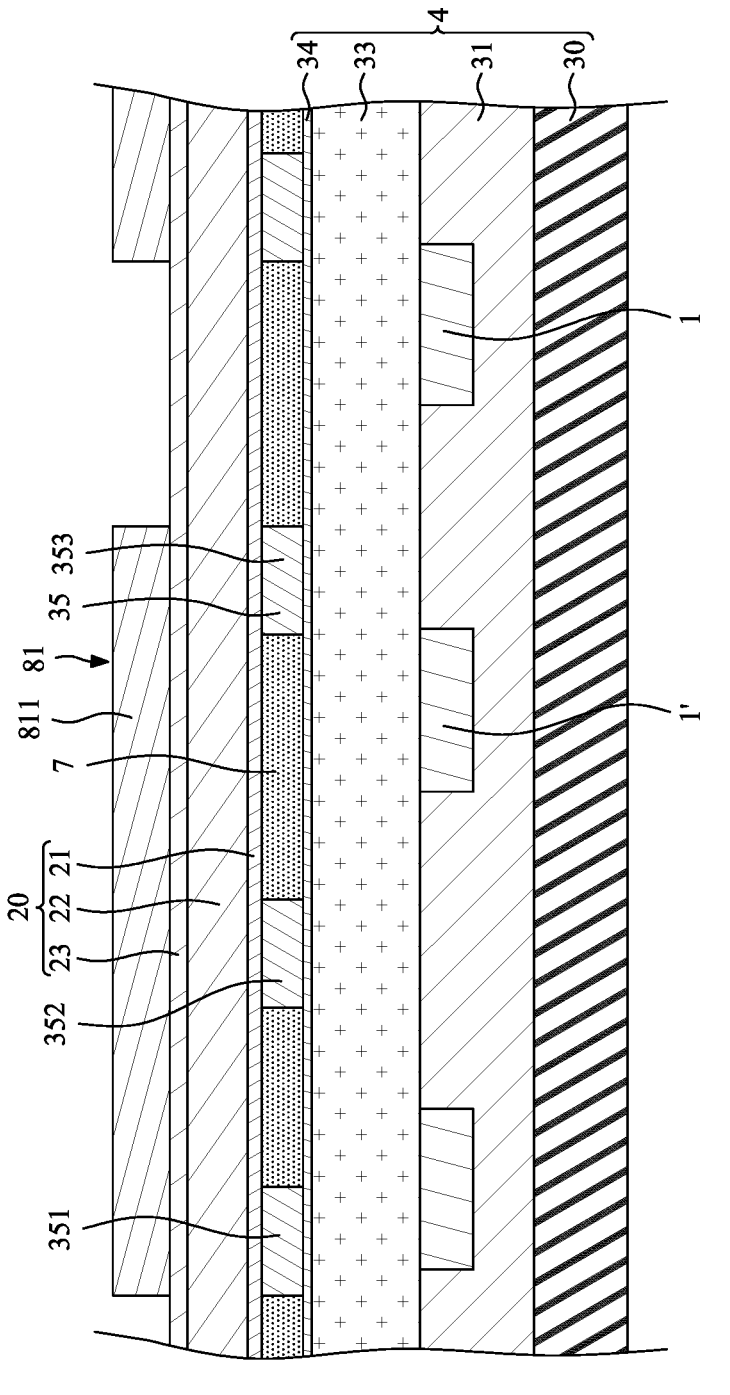
FIG. 25 is a schematic cross-sectional view taken along line A8-A8 of FIG. 24.
Figure 26:
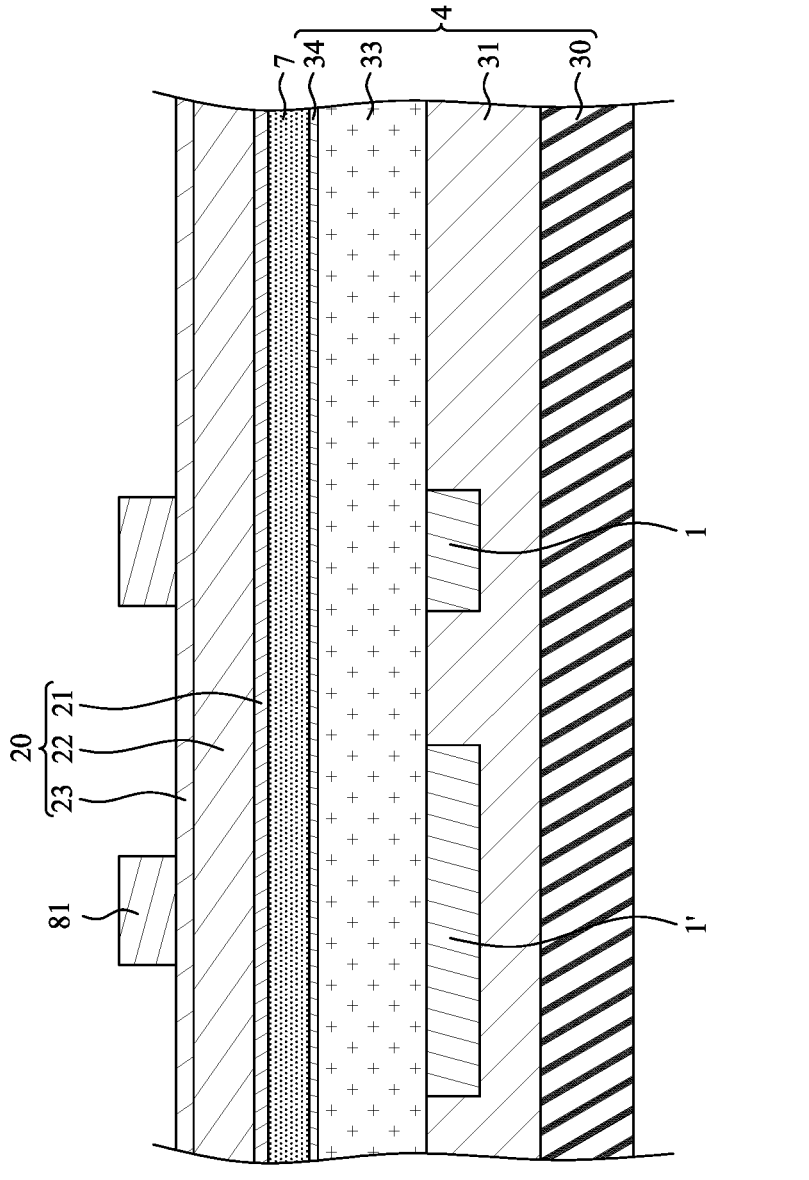
FIG. 26 is a schematic cross-sectional view taken along line B8-B8 of FIG. 24.

Referring to FIG. 24 to FIG. 26, wherein FIG. 25 is a schematic cross-sectional view taken along line A8-A8 of FIG. 24, FIG. 26 is a schematic cross-sectional view taken along line B8-B8 of FIG. 24, the photoresist layer 8 may be patterned to form a pattern 81 by using the photomask 9. The pattern 81 may include plurality of remaining portions such as remaining lines 811 (or remaining segments). The remaining lines 811 may correspond to the pattern 91 of the photomask 9. Meanwhile, a portion of the conductive metal structure 20 is exposed.

Figure 27:
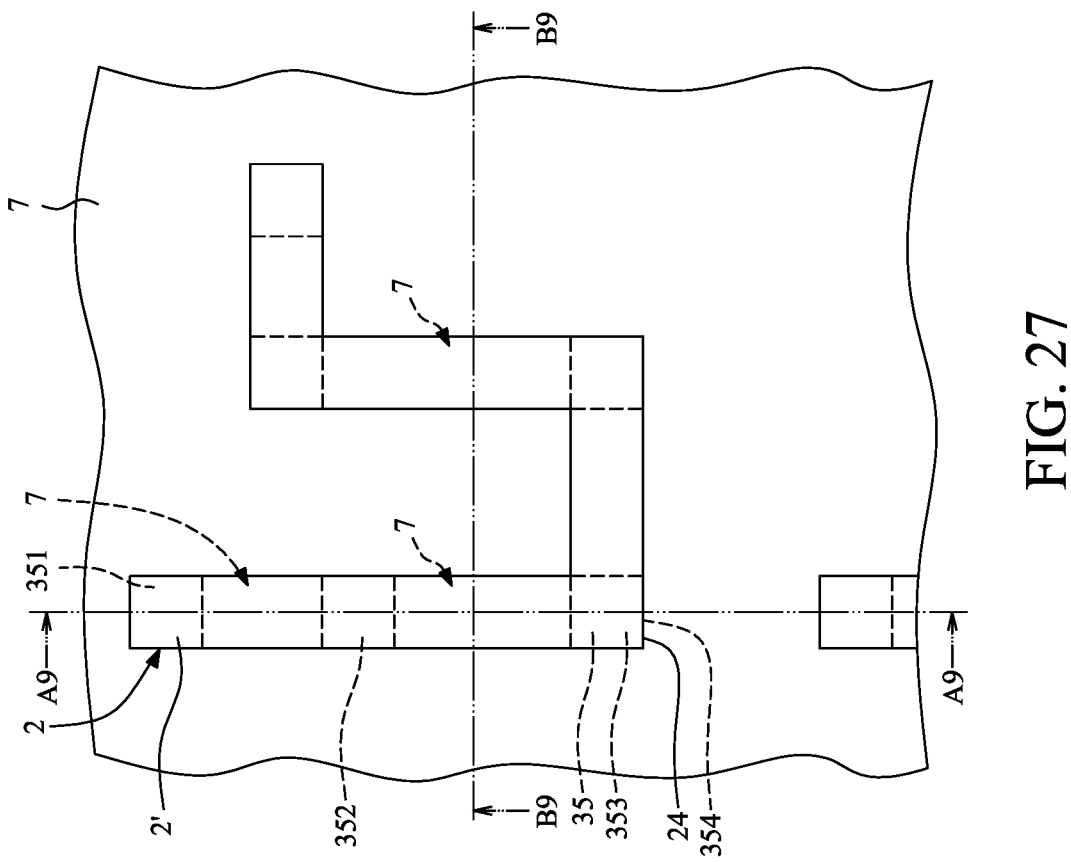
FIG. 27 illustrates one or more stages of a method of manufacturing a circuit structure in accordance with some embodiments of the present disclosure.
Figure 28:
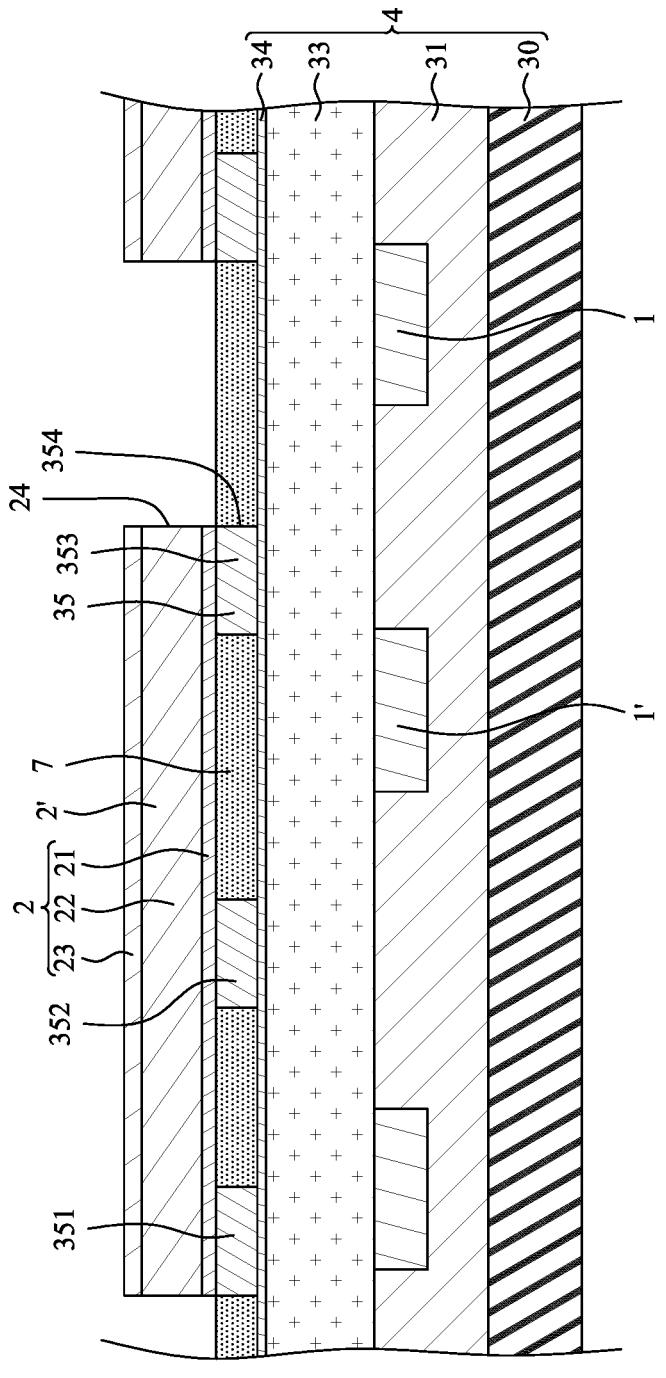
FIG. 28 is a schematic cross-sectional view taken along line A9-A9 of FIG. 27.
Figure 29:
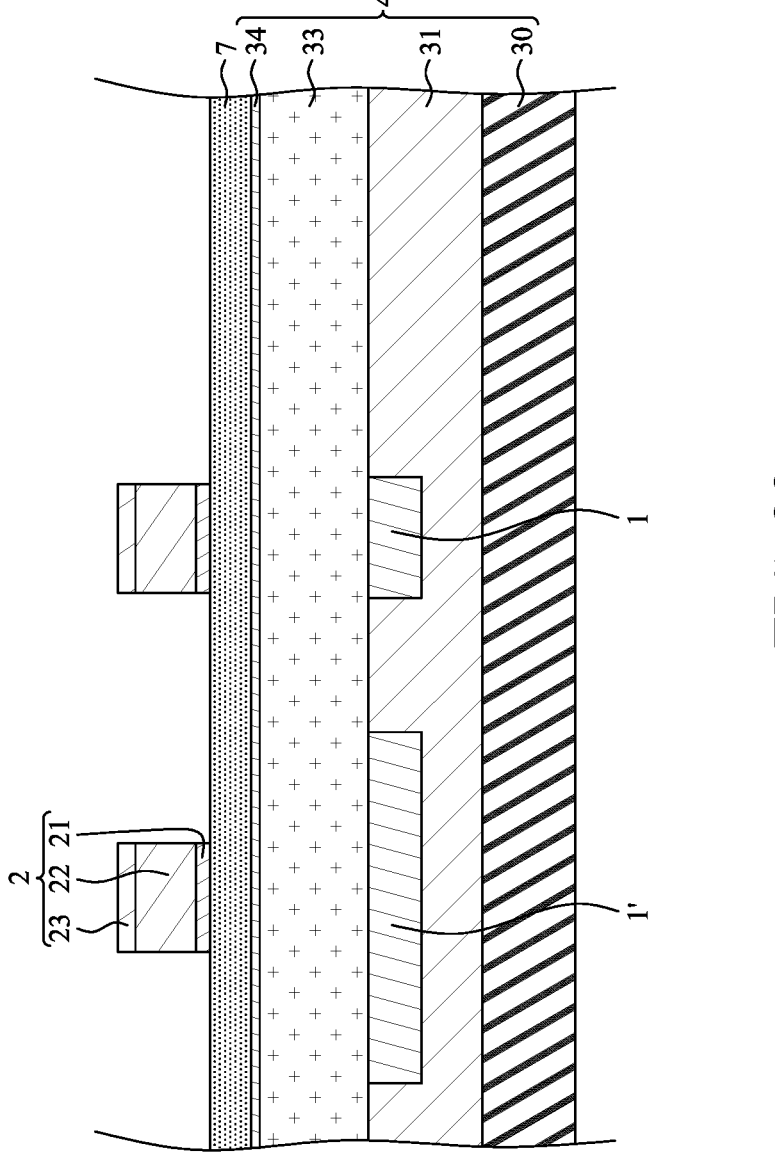
FIG. 29 is a schematic cross-sectional view taken along line B9-B9 of FIG. 27.

Referring to FIG. 27 to FIG. 29, wherein FIG. 28 is a schematic cross-sectional view taken along line A9-A9 of FIG. 27, FIG. 29 is a schematic cross-sectional view taken along line B9-B9 of FIG. 27, the conductive metal structure 20 may be patterned to form a second metal layer 2 including a plurality of second metal lines 2' by using the remaining lines 811 of the pattern 81 of the photoresist layer 8. For example, the exposed portion of the conductive metal structure 20 may be etched by using the remaining lines 811 of the pattern 81 of the photoresist layer 8 as a mask. For example, the second metal lines 2' may correspond to the remaining lines 811 respectively. Meanwhile, a portion of the filling material 7 is exposed.

Then, the remaining lines 811 of the pattern 81 of the photoresist layer 8 are removed by stripping. Thus, the second metal layer 2 (including the second metal lines 2') is formed or disposed on the filling material 7 and the supporting portions 35. In addition, the second metal layer 2 (including the second metal lines 2') is formed or disposed over the first metal layer 1 (including the first metal lines 1').

Figure 30:
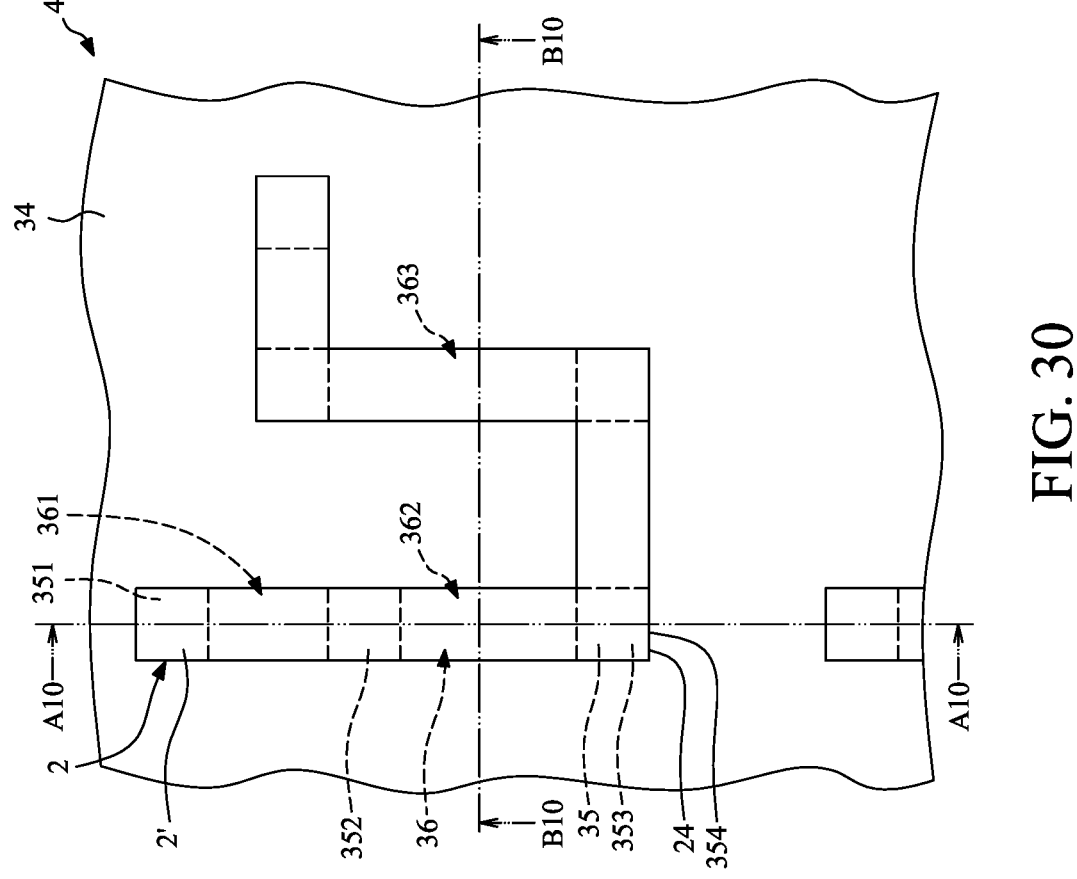
FIG. 30 illustrates one or more stages of a method of manufacturing a circuit structure in accordance with some embodiments of the present disclosure.
Figure 31:
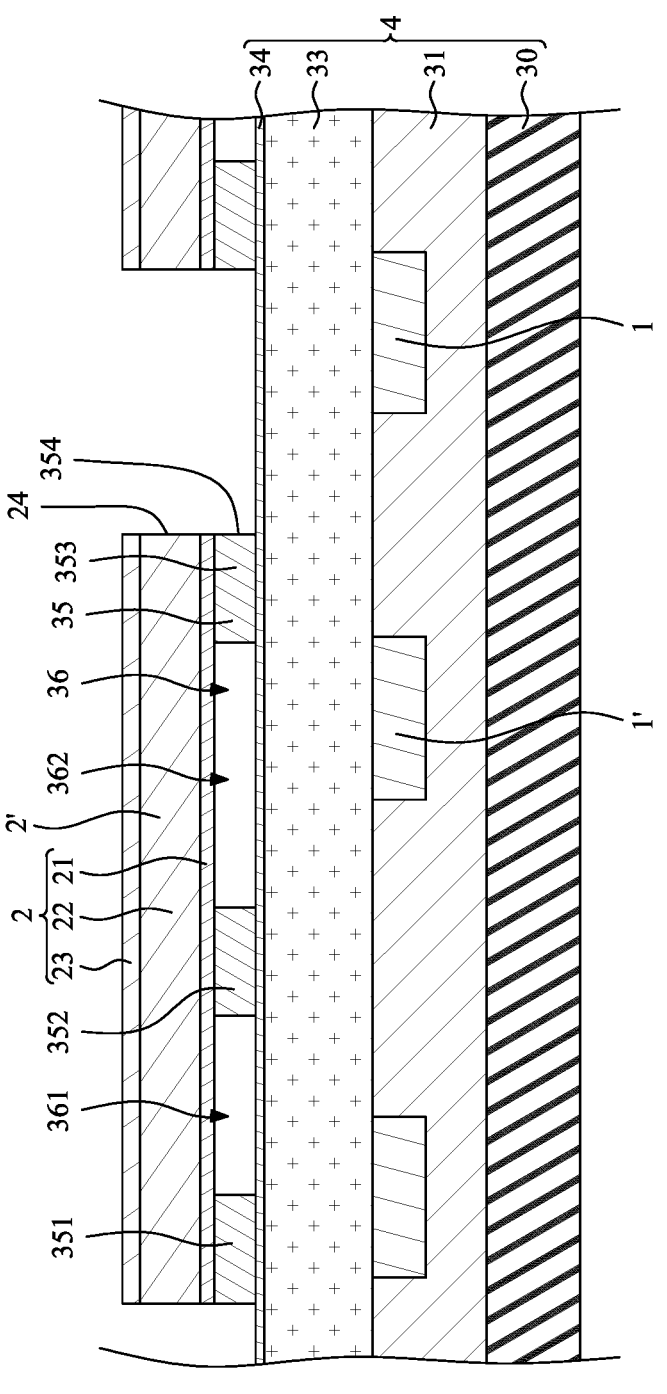
FIG. 31 is a schematic cross-sectional view taken along line A10-A10 of FIG. 30.
Figure 32:
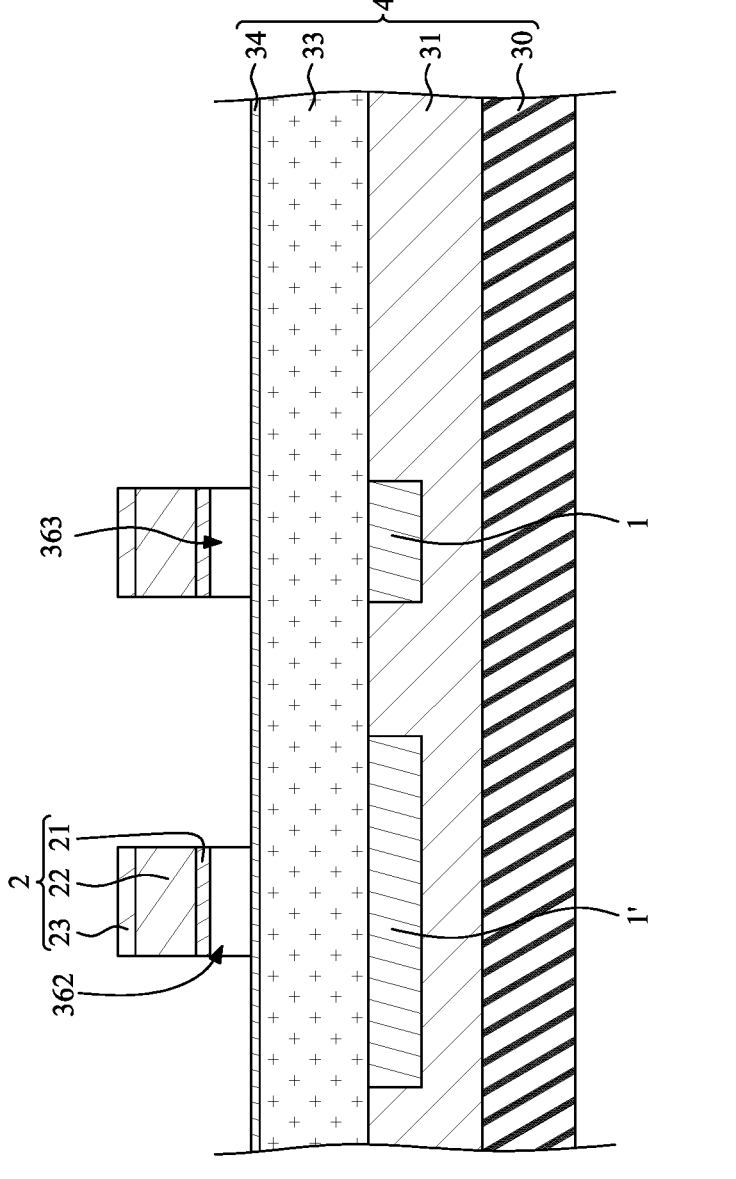
FIG. 32 is a schematic cross-sectional view taken along line B10-B10 of FIG. 30.

Referring to FIG. 30 to FIG. 32, wherein FIG. 31 is a schematic cross-sectional view taken along line A10-A10 of FIG. 30, FIG. 32 is a schematic cross-sectional view taken along line B10-B10 of FIG. 30, the filling material 7 may be removed to form a plurality of air gaps 36 between the supporting portions 35 under the second metal lines 2'. That is, the air gaps 36 are formed or disposed between the second metal layer 2 (including the second metal lines 2') and the first metal layer 1 (including the first metal lines 1'). Meanwhile, a portion of the mask layer 34 is exposed.

In some embodiments, the filling material 7 may be removed by using the supporting portions 35 and the mask layer 34 as masks. In some embodiments, the filling material 7 may be removed by a vapor hydrofluoric acid (VHF), and the supporting portions 35 and the mask layer 34 may resist the vapor hydrofluoric acid (VHF). Therefore, the supporting portions 35 and the second metal lines 2' may form at least one bridge-like structure.

In some embodiments, a second dielectric layer 32 may be formed or disposed on a portion of the mask layer 34 that is not covered by the second metal layer 2 (including the second metal lines 2') so as to form the circuit structure 3 shown in FIG. 1 to FIG. 3.

As shown in FIG. 1 to FIG. 3, the second dielectric layer 32 may contact the exposed portion of the mask layer 34, the first lateral surface 354 of the supporting portion 35 and the second lateral surface 24 of the second metal layer 2 (including the second metal lines 2'). The supporting portion 35 and the second metal layer 2 (including the second metal lines 2') are embedded in the second dielectric layer 32. A material of the second dielectric layer 32 may include oxide material or nitride material, such as silicon nitride ($Si_3N_4$, or SiN), silicon dioxide ($SiO_2$), silicon oxynitride ($N_2OSi_2$), silicon nitride oxide (SiON), tantalum pentoxide ($Ta_2O_5$), aluminum oxide ($Al_2O_3$), strontium bismuth tantalum oxide ($SrBi_2Ta_2O_9$, SBT), barium strontium titanate oxide (BaSrTiO$_3$, BST), or a combination thereof. In some embodiments, the material of the intermediate dielectric layer 33 may be same as the material of the second dielectric layer 32, both are silicon dioxide ($SiO_2$). The material of the second dielectric layer 32 may be different from the material of the mask layer 34.

In some embodiments, the second dielectric layer 32 may be in a film type, and may be formed by chemical vapor deposition (CVD), thus, the second dielectric layer 32 may not extend into the air gap 36. As a result, the air gap 36 is an empty space such as an enclosed empty space. In some embodiments, the second metal line 2', the mask layer 34, the second dielectric layer 32 and the supporting portions 35 collectively define the air gap 36 (e.g., the enclosed empty space). For example, the second air gap 362 is defined by a bottom surface 25 of the second metal line 2', a top surface 341 of the mask layer 34, an inner surface 355 of the third supporting portion 353, an inner surface 356 of the second supporting portion 352, two inner surfaces 323 of the second dielectric layer 32.

Figure 33:
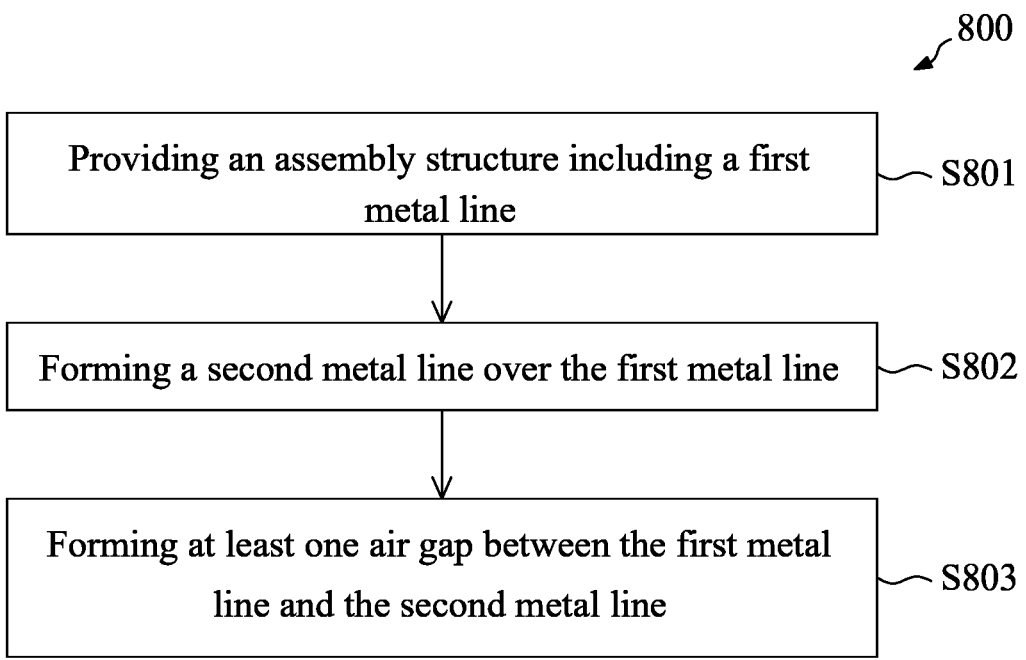
FIG. 33 illustrates a flow chart of a method of manufacturing a circuit structure in accordance with some embodiments of the present disclosure.

FIG. 33 illustrates a flow chart of a method 800 of manufacturing a circuit structure 3 in accordance with some embodiments of the present disclosure.

The step or operation S801 is providing an assembly structure including a first metal line. For example, as shown in FIG. 4 to FIG. 6, an assembly structure 4 is provided. The assembly structure 4 may include a base layer 30, a first dielectric layer 31, a first metal layer 1, an intermediate dielectric layer 33 and a mask layer 34. The first dielectric layer 31 may be formed or disposed on the base layer 30. The first metal layer 1 may be a patterned circuit layer, and may include a plurality of first metal lines 1'. The first metal layer 1 (including the first metal lines 1') is embedded in the first dielectric layer 31.

The step or operation S802 is forming a second metal line over the first metal line. For example, as shown in FIG. 27 to FIG. 29, the conductive metal structure 20 may be patterned to form a second metal layer 2 including a plurality of second metal lines 2' by using the remaining lines 811 of the pattern 81 of the photoresist layer 8 as a mask. Then, the remaining lines 811 of the pattern 81 of the photoresist layer 8 are removed by stripping. Thus, the second metal layer 2 (including the second metal lines 2') is formed or disposed on the filling material 7 and the supporting portions 35. In addition, the second metal layer 2 (including the second metal lines 2') is formed or disposed over the first metal layer 1 (including the first metal lines 1').

The step or operation S803 is forming at least one air gap between the first metal line and the second metal line. For example, as shown in FIG. 30 to FIG. 32, the filling material 7 of FIG. 27 to FIG. 29 may be removed to form a plurality of air gaps 36 between the supporting portions 35 under the second metal lines 2'. That is, the air gaps 36 are formed or disposed between the second metal layer 2 (including the second metal lines 2') and the first metal layer 1 (including the first metal lines 1').

One aspect of the present disclosure provides a circuit structure. The circuit structure includes a first metal line and a second metal line. The second metal line is disposed over the first metal line. At least one air gap is disposed between the first metal line and the second metal line.

Another aspect of the present disclosure provides a circuit structure. The circuit structure includes a first metal line, a second metal line and a middle structure. The second metal line is disposed over the first metal line. The middle structure is interposed between the first metal line and the second metal line, and is configured to reduce a parasitic capacitance between the first metal line and the second metal line. The middle structure includes three different materials.

Another aspect of the present disclosure provides a method of manufacturing a circuit structure. The method includes: providing an assembly structure including a first metal line; forming a second metal line over the first metal line; and forming at least one air gap between the first metal line and the second metal line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit structure, comprising:
a first metal line;
a second metal line disposed over the first metal line, wherein at least one air gap is disposed between the first metal line and the second metal line;
a first dielectric layer which is a solid layer, wherein the first metal line is embedded in the first dielectric layer, wherein the first dielectric layer is made of oxide material or nitride material;
a second dielectric layer, which is a solid layer, having a plurality of portions spaced apart from each other, wherein the portions of the second dielectric layer are separated by the air gap;
a plurality of supporting portions embedded in the second dielectric layer and formed between the portions of the second dielectric layer;
a mask layer disposed between an intermediate dielectric layer and the second dielectric layer, wherein a bottom surface of the second dielectric layer is in contact with a top surface of the mask layer; and
the intermediate dielectric layer, wherein a top surface of the first metal line is coplanar with a top surface of the first dielectric layer, wherein the intermediate dielectric layer is disposed on and in contact with the top surface of the first metal line and the top surface of first dielectric layer so as to cover the first metal line and the first dielectric layer;
wherein the second metal line comprises a first layer, a second layer and a third layer stacked on one another to form a patterned circuit layer,
wherein a top surface of the third layer is coplanar with a top surface of the second dielectric layer;
wherein the air gap is enclosed by two inner surfaces of the portions of the second dielectric layer and a bottom surface of the first layer;
wherein the plurality of supporting portions are spaced apart from each other to define the air gap, such that the air gap is further defined by an inner surface of one of the supporting portions, wherein each of the supporting portions is in contact with the bottom surface of the first layer;
wherein a thickness of one of the plurality of supporting portions is substantially equal to a height of the at least one air gap;
wherein the intermediate dielectric layer is disposed between the first dielectric layer and the second dielectric layer, wherein the intermediate dielectric layer is disposed on the top surface of the first dielectric layer to cover and to contact with the top surface of the first metal line;
wherein the at least one air gap is defined by the top surface of the mask layer and the bottom surface of the second metal line.

2. The circuit structure of claim 1, wherein the plurality of supporting portions support the second metal line, wherein a bottom surface of each of the supporting portions is coplanar with a bottom surface of the second dielectric layer, wherein a thickness of the second dielectric layer is equal to a sum of a thickness of the second metal line and a height of each of the supporting portions.

3. The circuit structure of claim 1, wherein a third width of one of the plurality of supporting portions is substantially equal to a second width of the at least one air gap from a top view.

4. The circuit structure of claim 1, wherein a third width of one of the plurality of supporting portions is substantially equal to a first width of the second metal line from a top view.

5. The circuit structure of claim 1, wherein a first lateral surface of one of the plurality of supporting portions is substantially aligned with a second lateral surface of the second metal line and is contact with one of the two inner surfaces of the portions of the second dielectric layer.

6. The circuit structure of claim 1, wherein a first width of the second metal line is substantially equal to a second width of the at least one air gap from a top view, wherein the first metal line is embedded in the first dielectric layer at a position that a bottom surface of the first metal line is positioned above a bottom surface of the first dielectric layer.

7. The circuit structure of claim 1, wherein each of the first dielectric layer and the second dielectric layer is made of dielectric material comprising oxide material or nitride material.

* * * * *